United States Patent [19]
Hineno et al.

[11] Patent Number: 5,582,493
[45] Date of Patent: Dec. 10, 1996

[54] AUTOMATIC ELECTRONIC PARTS MOUNTING DEVICE

[75] Inventors: Kazuhiro Hineno, Ohizumi-machi; Masao Okado, Menuma-machi, both of Japan

[73] Assignee: Sanyo Electric Co., Ltd., Osaka-ku, Japan

[21] Appl. No.: 182,960

[22] Filed: Jan. 18, 1994

[30] Foreign Application Priority Data

Jan. 18, 1993 [JP] Japan ................... 5-006204

[51] Int. Cl.⁶ ................................. B65G 53/38
[52] U.S. Cl. ................................. 406/137
[58] Field of Search ................ 406/137, 138, 406/136, 88, 123; 221/163, 197, 200, 202; 222/630; 414/788

[56] References Cited

U.S. PATENT DOCUMENTS

| | | | |
|---|---|---|---|
| 3,993,359 | 11/1976 | Sweeney | 406/137 |
| 4,033,031 | 7/1977 | Ballew . | |
| 4,214,844 | 7/1980 | Cockayne | 406/137 |
| 4,459,743 | 7/1984 | Watanabe et al. . | |
| 4,759,124 | 7/1988 | Snyder et al. . | |
| 4,801,044 | 1/1989 | Kubota et al. | 406/137 |
| 5,075,961 | 12/1991 | St. Hilaire . | |

FOREIGN PATENT DOCUMENTS 2262736  6/1993  United Kingdom .

Primary Examiner—Stephen Avila
Attorney, Agent, or Firm—Hazel & Thomas

[57] ABSTRACT

An automatic electronic parts mounting device wherein a feed table having a plurality of parts feed units, which guide chip parts stored in a storeroom for parts to a shoot connected with said storeroom and separate the parts from an exit of the shoot by a separating device to feed them to a parts feeding position, moves to a direction arranged of said unit and a suction nozzle picks up the chip parts from desired said unit suspended at a parts picking-up position to mount it to a printed substrate, wherein there are provided an air jet passage arranged in each parts feed unit for jetting air so as to stir and guide chip parts stored in the storeroom for parts or to transfer chip parts aligned in the shoot to the exit side of the shoot, an air feed device for feeding air to said air jet passage, and an attaching/detaching device arranged outside said feed table for attaching/detaching the air feed device to said air jet passage, is disclosed. According to the device of the present invention, when the attaching/detaching device attaches the air feed means to the air jet passage in the parts feed unit, it makes possible to jet air from the air jet passage to stir the chip parts or to transfer them in the shoot, and detachment of the air feed means makes the feed table movable.

4 Claims, 25 Drawing Sheets

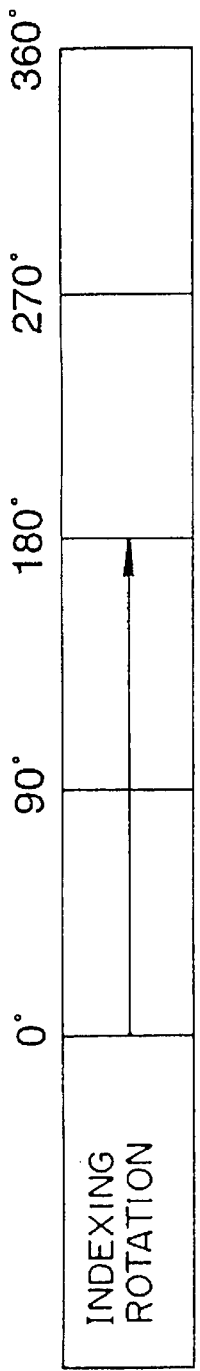
FIG. 24A  INDEXING ROTATION
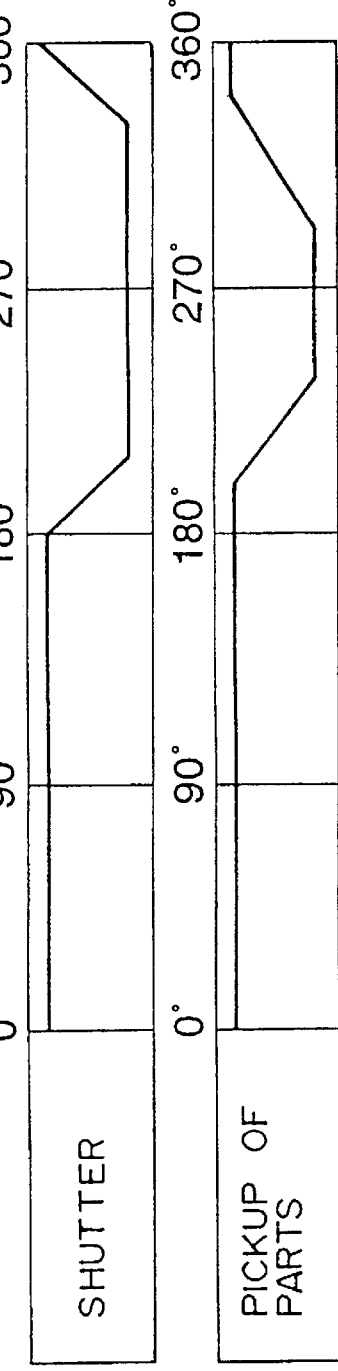
FIG. 24B  SHUTTER
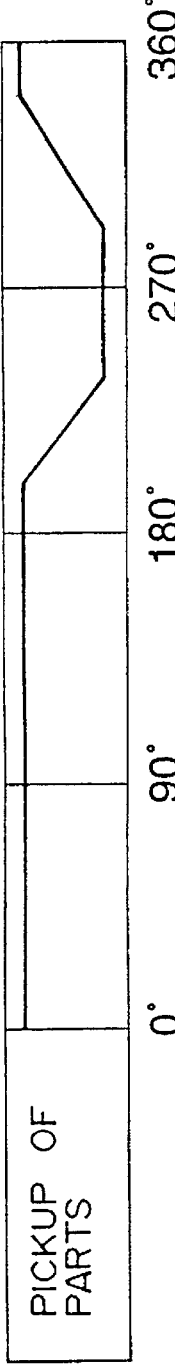
FIG. 24C  PICKUP OF PARTS
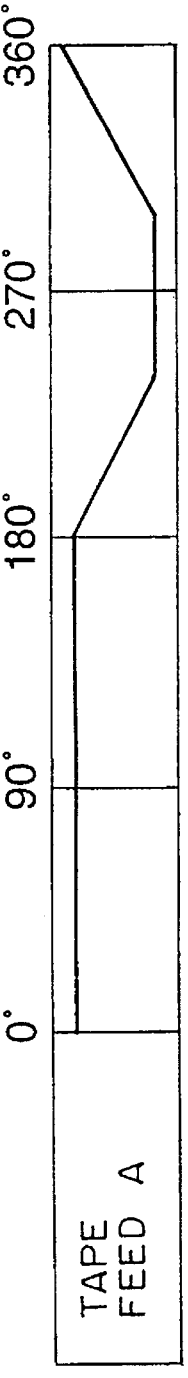
FIG. 24D  TAPE FEED A
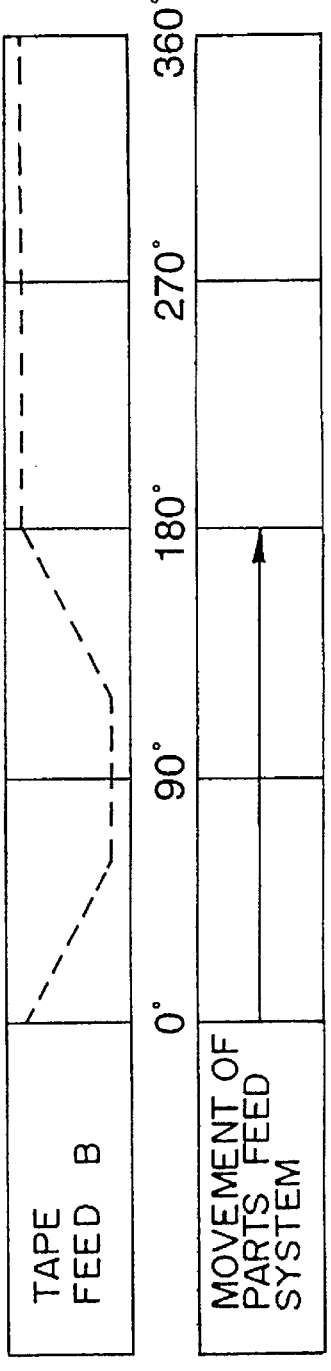
FIG. 24E  TAPE FEED B
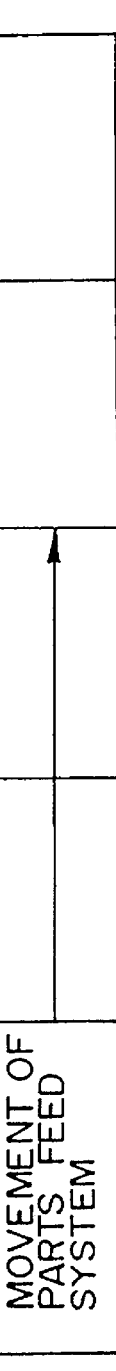
FIG. 24F  MOVEMENT OF PARTS FEED SYSTEM

AUTOMATIC ELECTRONIC PARTS MOUNTING DEVICE

BACKGROUND OF THE INVENTION

1. Field of the Invention

The present invention relates to an automatic electronic parts mounting device wherein a feed table having a plurality of parts feed units, which guide chip parts stored in a storeroom for parts to a shoot connected with said storeroom and separate the parts from an exit of the shoot by a separating means to feed them to a parts feeding position, moves to a direction arranged of said units, and a suction nozzle picks up the chip parts from desired said unit suspended at a parts picking-up position to mount it to a printed substrate.

2. Background Art

In such kind of automatic electronic parts mounting device, chip parts aligned by being guided to a shoot indicated at 204 by spouting of compressed air through a jet hole from a storeroom for parts indicated at 202 per one unit of parts feed units provided on a feed table indicated at 200 which moves as shown in FIG. 29, is conventionally transferred into the shoot 204 by spouting of the compressed air, separately stored per one unit in a groove provided in a rotative separating body indicated at 205 at the exit of the shoot 204, fed to the sucking position of chip parts by a rotation of said rotative separating body 205 and sucked by a vacuum-sucking nozzle indicated at 206 moving downwards. Furthermore, when it is separated by a rotative separating body 205, the separation is helped by a vacuum-sucking through a vacuum-sucking passage indicated at 207. To this parts feed unit indicated at 201, a compressed air tube 208 which feeds compressed air to a jet hole indicated at 203 is connected, said tube 208 being connected to a compressed air source (not shown) which is fixed to a body of an automatic electronic parts-mounting device in which a feed table indicated at 200 is mounted movably. Furthermore, a vacuum tube indicated at 209 associated with a vacuum-sucking passage 207 is connected to said unit 201, and associated with a not-shown vacuum source fixed to the body.

In this case, however, if a number of such parts feed units 201 are arranged on a feed table 200, there has been a defect that it needs much time to detach a compressed air tube 208 and a vacuum tube 209 per unit 201 for detaching/attaching to exchange an unit 201 due to shortage of parts, or change of kinds of substrate subject to be mounted.

Therefore, Japanese Patent Laid-Open Publication No. 3-145799 discloses a technique in which an air jet nozzle is provided suspended rest in the vicinity of a sucking position of a suction nozzle on the side of the body against a moving parts feed table (corresponding to the above feed table 200), jets and feeds air to the air introducing hole of a parts feed unit which moves to the sucking position without being connected to the parts feed unit.

SUMMARY OF THE INVENTION

In the above-mentioned conventional technique, however, since there is provided a predetermined space between a jet nozzle and an air introducing hole so that a jet nozzle does not contact with a parts feed table, leak is caused and in order to feed air having necessary strength into a parts feed unit, much stronger compressed air must be blown, making the compressed air source having greater capacity. Furthermore, there is another defect in that since the compressed air leaks outside the parts feed unit, there is a threat that chip parts aligned in the shoot are blown off or parts sucked by the sucking nozzle are blown off.

Therefore, the object of the present invention is to reduce the leakage of compressed air or vacuum pressure in the case where there is a necessity to feed compressed air or vacuum pressure to the parts feed units, and reduce the time required for attaching a parts feed unit to a feed table.

The present invention, therefore, provides an automatic electronic parts mounting device wherein a feed table having a plurality of parts feed units, which guide chip parts stored in a storeroom for parts to a shoot connected with said storeroom and separate the parts from an exit of the shoot by a separating means to feed them to a parts feeding position, moves to a direction arranged of said unit and a suction nozzle picks up the chip parts from desired said unit suspended at a parts picking-up position to mount it to a printed substrate, wherein there are provided an air jet passage arranged in each parts feed unit for jetting air so as to stir and guide chip parts stored in the storeroom for parts or to transfer chip parts aligned in the shoot to the exit side of the shoot, an air feed means for feeding air to said air jet passage, and an attaching/detaching means arranged outside said feed table for attaching/detaching said air feed means to said air jet passage.

Furthermore, the present invention provides an automatic electronic parts mounting device wherein a feed table having a plurality of parts feed units arranged thereon, which guide chip parts stored in a storeroom for parts to a shoot connected with said storeroom and separate the parts from an exit of the shoot by a separating means to feed them to a parts feeding position, moves to a direction arranged of said unit and a suction nozzle picks up the chip parts from desired said unit suspended at a parts picking-up position to mount it to a printed substrate, wherein there are provided a vacuum-sucking passage arranged in each parts feed unit for vacuum-sucking chip parts separated by said separating means, a vacuum pressure feed means for feeding vacuum pressure to said vacuum-sucking passage, and an attaching/detaching means arranged outside said feed table for attaching/detaching said vacuum pressure feed means to said vacuum-sucking passage.

Furthermore, the present invention provides a drive member outside said feed table for initiating separating action of said separating means, and said attaching/detaching means as set forth in claim 1 or 2 integrally arranged to said drive member.

According to the structure of claim 1, when the attaching/detaching means attaches the air feed means to the air jet passage in the parts feed unit, it makes possible to jet air from the air jet passage to stir the chip parts or to transfer them in the shoot, and detachment of the air feed means makes the feed table movable.

Furthermore, according to the structure of claim 2, when the attaching/detaching means attaches the vacuum pressure feed means to the vacuum-sucking passage in the parts feed unit, it makes possible for the vacuum-sucking passage to vacuum-suck the chip parts separated from the shoot by a separating means, and detachment of the vacuum pressure feed means makes the feed table movable.

Furthermore, according to the structure of claim 3, when the drive member initiates the separating motion of the separating means, the attaching/detaching means provided integrally to said drive member attaches the air feed means

BRIEF DESCRIPTION OF THE DRAWINGS

FIG. 24 is a view showing the timing chart.

DESCRIPTION OF THE REFERENCE NUMERAL

Figure 1:
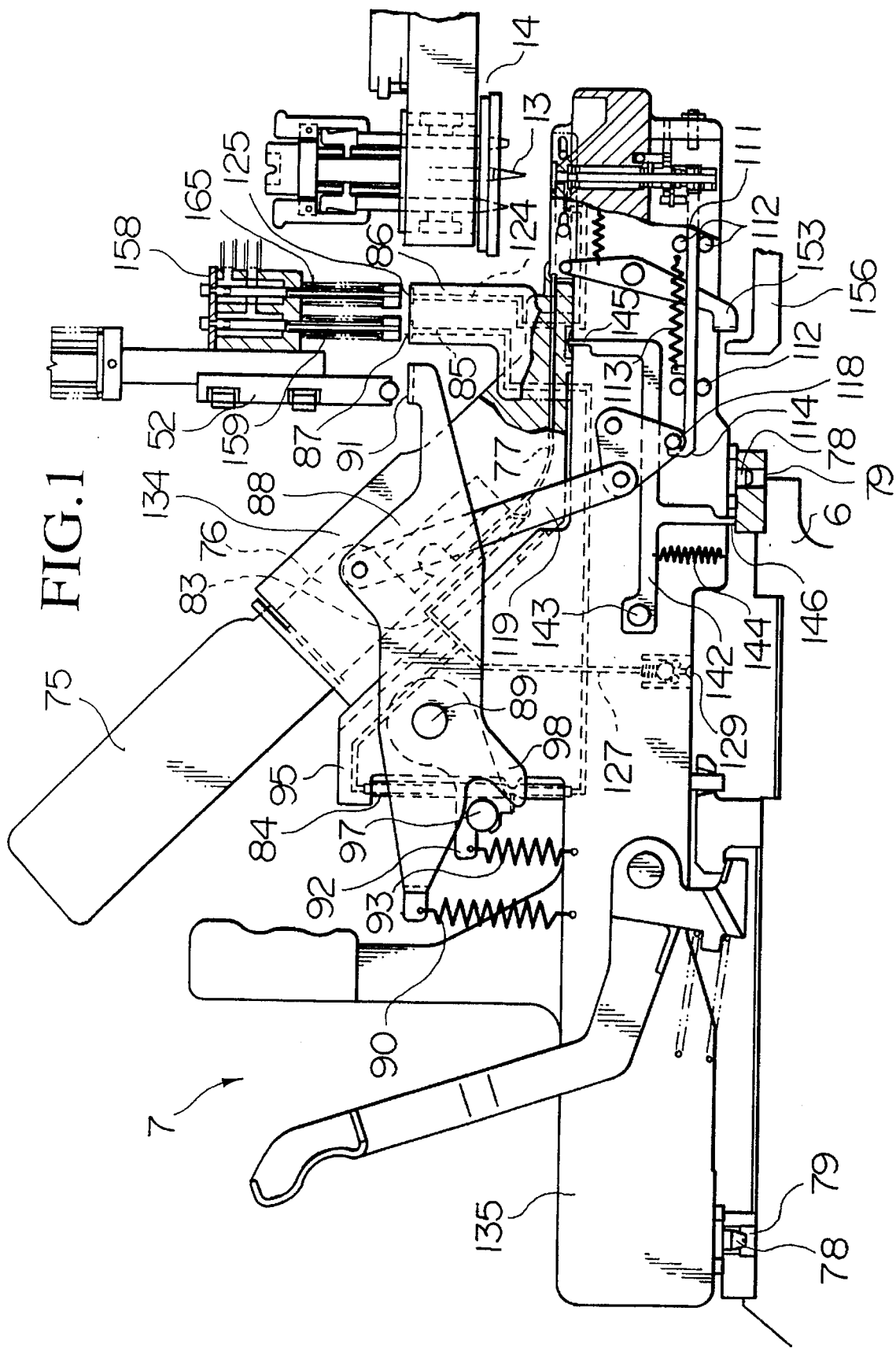
FIG. 1 is a side view of the parts feed unit.

4 Chip-shaped electronic parts (chip parts)
5 Printed substrate
6 Feed table
7 Parts feed device (parts feed unit)
13 Suction nozzle
52 Reciprocating rod
53 Reciprocating rod
54 Reciprocating rod
76 Chamber (storeroom for parts)
77 Shoot
81 Chamber compressed air feed hole (air jet passage)
82 Shoot compressed air feed hole (air jet passage)
101 Rotor
122 Vacuum hole (vacuum-sucking passage)
123 Groove-circulating hole (vacuum-sucking passage)
125 Vacuum opening (vacuum-sucking passage)
158 Air pressure feed block (detachable means)
159 Compressed air feed rod (air feed means)
162 Airhole (air feed means)
165 Negative pressure feed rod (vacuum pressure feed means)
168 Airhole (vacuum pressure feed means)

DETAILED DESCRIPTION OF THE PREFERRED EMBODIMENTS

Preferred embodiments of the present invention will now be described with reference to the drawings hereinafter.

Figure 2:
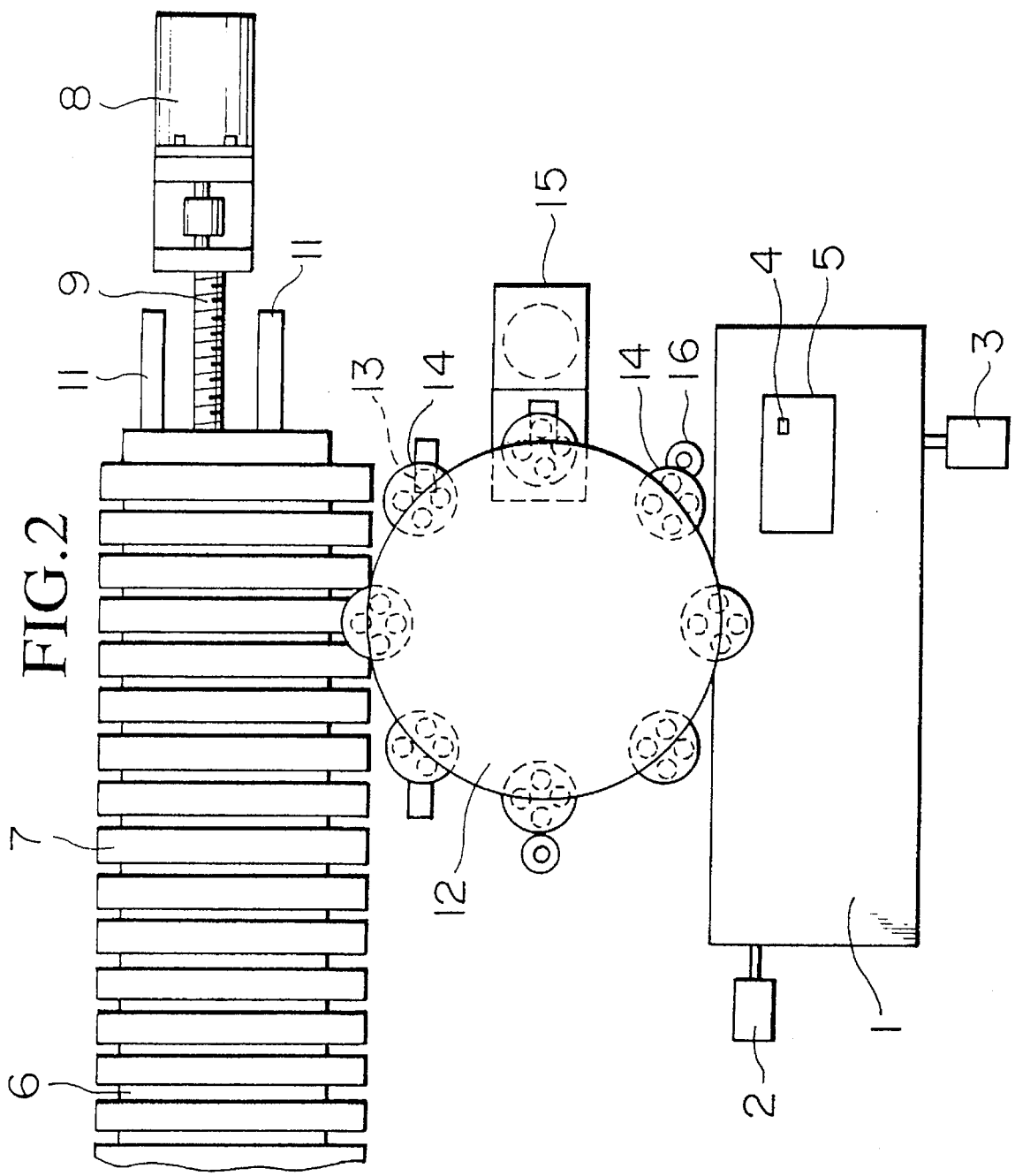
FIG. 2 is a plane view of the automatic electronic parts mounting device to which the present invention is applied.
Figure 3:
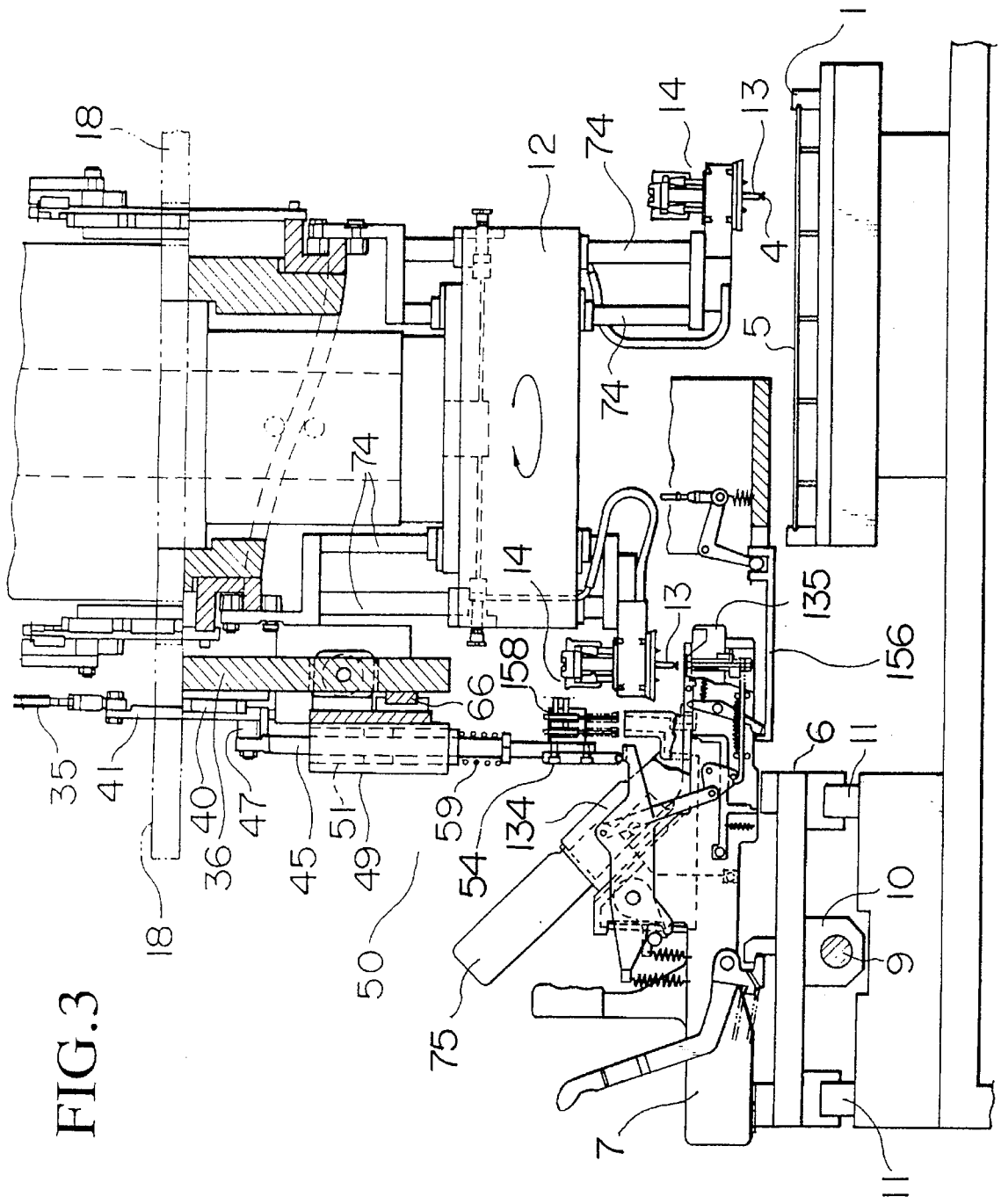
FIG. 3 is a side view including XX section of FIG. 4 to a part of the automatic electronic parts mounting device to which the present invention is applied.

Referring to FIGS. 2 and 3, an XY-table indicated at 1 is driven by an X-axial motor 2 and a Y-axial motor 3 to travel in the directions of X- and Y-axes. A printed substrate 5 on which chip-shaped electronic parts 4 (hereinafter referred to as "chip parts" or "parts") are mounted is placed on the XY-table 1. A feed table indicated at 6 receives a number of parts feed units indicated at 7 thereon. Each parts feed unit 7 feeds one kind of parts 4. A motor indicated at 8 for driving the feed table 6 rotates a ball bearing screw shaft indicated at 9 to move the feed table 6 along a linear guide indicated at 11 by means of an engagement of the ball bearing screw shaft 9 with a nut indicated at 10 fastened to the underside of the feed table 6. 12 indicates a turntable which intermittently rotates, and the periphery of the turntable 12 has a plurality of parts mounting head indicated at 14 having four sucking nozzles 13 arranged by an indexation pitch there around.

The mounting head 14 is passing through the turntable 12 as shown FIG. 3, attached to the lower part of the head reciprocating shaft indicated at 74 provided vertically movably, and moves vertically by means of the reciprocating movement of said shaft 74 at the suction station by a reciprocating drive source (not shown).

A stay position of the parts sucking and mounting heads 14 at which the suction nozzles 13 picked up parts 4 out of the parts feed units 7 constitutes a suction station. The suction nozzles 13 suck out parts 4 at said suction station.

The mounting head 14 subsequently stays at a recognition station. There, a parts recognizer 15 recognizes a possible dislocation of a part 4 retained by the suction nozzles 13.

The mounting head 14 subsequently stays at an angle correction station. There, a nozzle rotating roller 16 rotates the suction nozzle 13 in the direction of θ in response to an output of the parts recognizer 15 to correct a possible rotational dislocation of the part 4.

The mounting head 14 subsequently stays at a parts mounting station and mounts the part 4 retained by the suction nozzles 13 on the printed substrate 5.

Figure 4:
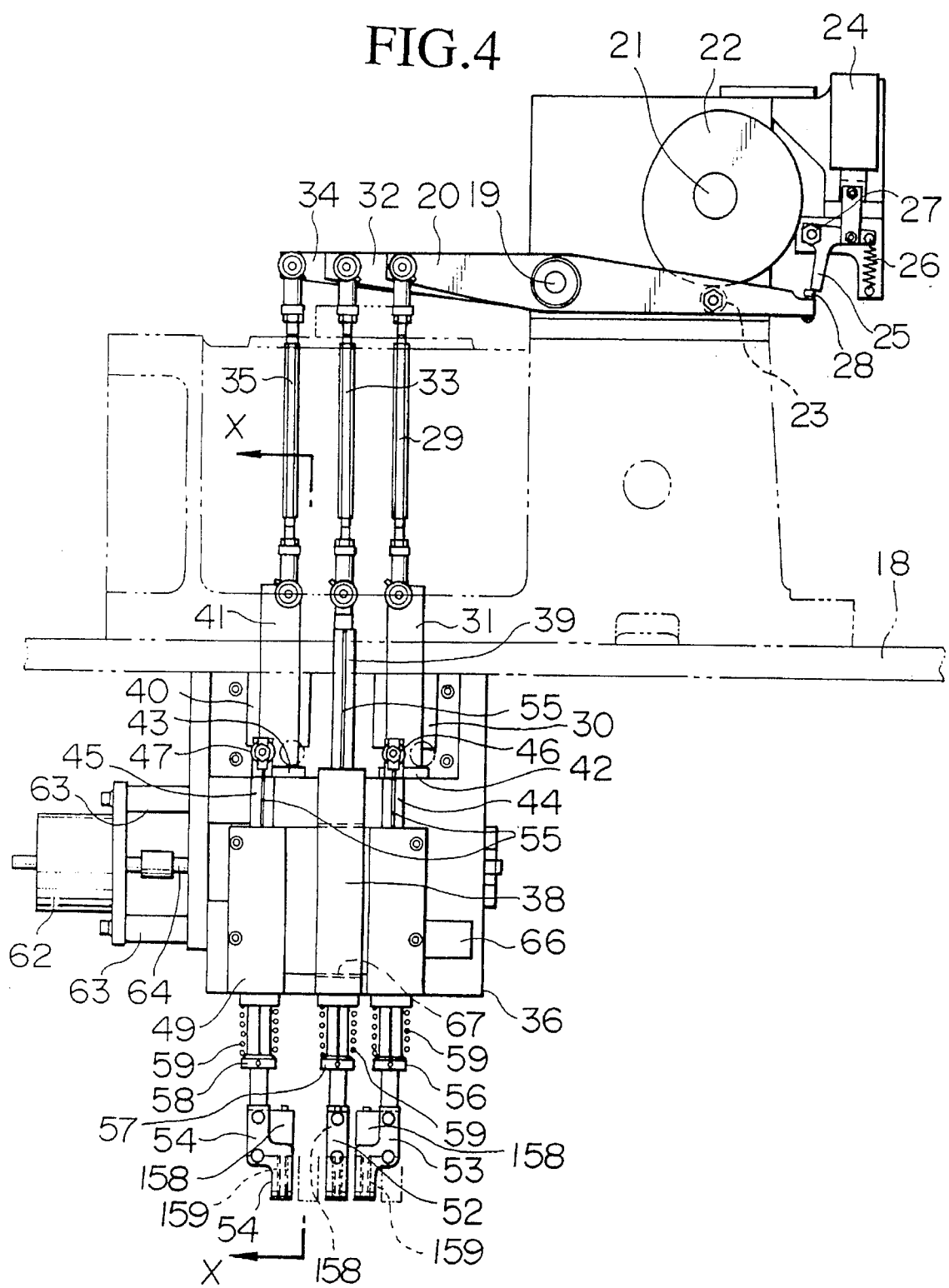
FIG. 4 is an elevational view showing the reciprocating mechanism and moving mechanism of the reciprocating rod.

In FIGS. 3 and 4, a supporting table is indicated at 18. An oscillating lever 20 is mounted on a lever pivot 19 fastened to the supporting table 18. The lever 20 has a cam follower indicated at 23 fastened thereto and engaging a bottom edge surface of a cam indicated at 22 mounted fixedly to a shaft indicated at 21 mounted rotatably to the supporting table 18. A solenoid indicated at 24 drives a plunger to reciprocate a restraining lever indicated at 25 about a pivot indicated at 27 against the force of a tension spring indicated at 26. As shown in FIG. 4, the right-hand end of the lever 20 has a restraining bolt indicated at 28 fitted thereinto. When the tension spring 26 has fully moved the restraining lever 25 clockwise after de-energization of the solenoid 24, the restraining lever 25 engages the head of the bolt 28 to restrain the counterclockwise movement of the lever 20. The left-hand end of the lever 20 has a vertical reciprocating rod indicated at 29 pivotally mounted thereon. The lower end of the vertical reciprocating rod 29 has a vertical board indicated at 31 vertically reciprocating along a linear guide indicated at 30.

The intermittent rotation of the turntable 12 is performed by transmitting the rotation of the index motor (not shown) to the input axis (not shown) of the index unit and connecting the turntable 12 to the output axis of said index unit.

Every time the input axis to which the rotation of said index motor of said index unit is transmitted rotates one turn, the turntable 12 rotates by the space arranged of the mounting head 14. Said cam shaft 21 is connected to the index motor and is driven so as to rotate one turn, while said input axis rotates one turn synchronously with the rotation of the input axis of the index unit.

From 0° to 360° in FIG. 24 described below shows one turn of said cam shaft 21, namely one turn of the input axis of said index unit, and various movements caused during one intermittent rotation is shown in a graph in relation to the rotation angle of the input axis of the index unit. Respective movements are performed by a rotation of a cam (not shown) which is driven by the index unit to rotate synchronously with the input axis of the index unit as in the case of the cam shaft 21.

32 indicates an oscillating lever on which a vertical reciprocating rod 33 is pivotally mounted. The lever 32 is pivotally mounted on the pivot 19 and has a cam follower (not shown) engaging a cam (not shown) mounted fixedly to the cam shaft 21 behind the cam 22 in the same manner as the lever 20. The lever 32 is engageable with the same restraint including a solenoid (not shown) as the restraint including the solenoid 24.

34 indicates an oscillating lever on which a vertical reciprocating rod 35 is pivotally mounted. The lever 34 is pivotally mounted on the pivot 19 and has a cam follower (not shown) engaging a cam (not shown) mounted fixedly to the cam shaft 21 behind the cam 22 in the same manner as the lever 20. The lever 32 is engageable with the same restraint including a solenoid (not shown) as the restraint including the solenoid 24.

The underside of the supporting table 18 has a mounting plate 36 fastened thereto. The linear guide 30 is mounted to the mounting plate 36. A block for attaching a reciprocating rod indicated at 38 containing a ball spline is mounted on the mounting plate 36, and a spline shaft 39 mounted to the lower portion of the reciprocating rod 33 is passing through it. A linear guide indicated at 40 is mounted on the mounting plate 36 and guides a vertical reciprocating board 41 fixed to the lower end of the reciprocating rod 35.

The lower ends of the respective vertical reciprocating boards 31 and 41 terminate in lateral tabs indicated at 42 and 43. Rollers indicated at 46 and 47 mounted atop spline shafts indicated at 44 and 45 ride on the lateral tabs 42 and 43 so that the vertical reciprocating boards 31 and 41 suspend the spline shafts 44 and 45.

Blocks indicated at 48 and 49 are mounted on a moving body indicated at 50. The block 48 contains a ball spline (not shown) meshing the spline shaft 44 which passes vertically through the block 48. The block 49 contains a ball spline 51 meshing the spline shaft 45 which passes vertically through the block 49.

Lower ends of the spline shafts 39, 44 and 45 have reciprocating rods indicated at 52, 53 and 54 fastened thereto. Since each of the spline shafts 39, 44 and 45 has a rotational detente indicated at 55 extending therealong, the reciprocating rods 52, 53 and 54 do not rotate in the horizontal plane. The reciprocating rod 52 is provided upwards of the parts feed device 7 at the parts-sucking position. Moreover, springs indicated at 59 are seated around the spline shafts 39, 44 and 45 between the undersides of the blocks 48, 38 and 49 and retainers 56, 57 and 58 mounted fixedly to the spline shafts 39, 44 and 45. The respective springs 59 urge the spline shafts 39, 44 and 45 downwards to urge the tape driving lever 20, 32 and 34 counterclockwise so that the respective cam followers 23 and cam followers (not shown) of the tape driving levers 32 and 34 engage the cams 22 and the other cams (not shown).

A motor indicated at 62 is supported by a support 63 on the mounting plate 36. The motor 62 drives a ball bearing screw shaft indicated at 64 to horizontally move a nut indicated at 65 meshing the ball bearing screw shaft 64 in FIG. 4. The moving body 50 to which the nut 65 is fastened moves along a linear guide indicated at 66 between right and left in FIG. 4. The block 38 has a recess indicated at 67 allowing the moving body 50 to pass across the recess 67.

Movement of the moving body 50 causes the rollers 46 and 47 mounted atop the spline shafts 44 and 45 to travel along the lateral tabs 42 and 43, causing the reciprocating rods 53 and 54 to move between right and left in FIG. 4. The rotational limit of the ball bearing screw shaft 62 and widths of the lateral tabs 42 and 43 are selected so that the travel distance of each of the rollers 46 and 47 is restricted to the extent between a position in FIG. 4 and a position in broken line shown in FIG. 4. When the rollers 46 and 47 are in the positions in broken lines, the reciprocating rods 53 and 54 are in positions in two-dot chain lines as shown in FIG. 1.

The reciprocating rod 52 vertically reciprocates right above parts feed unit 7 positioned at a position of the suction of the part 4 by the feed table 6, to drive the parts feed unit 7 to feed parts as described later. The reciprocating rods 53 and 54 vertically reciprocate to drive the parts feed units 7 on opposite sides of the parts feed unit at the position of suction of the part 4.

Parts feed unit 7 will now be described with regards to the drawings.

Figure 5:
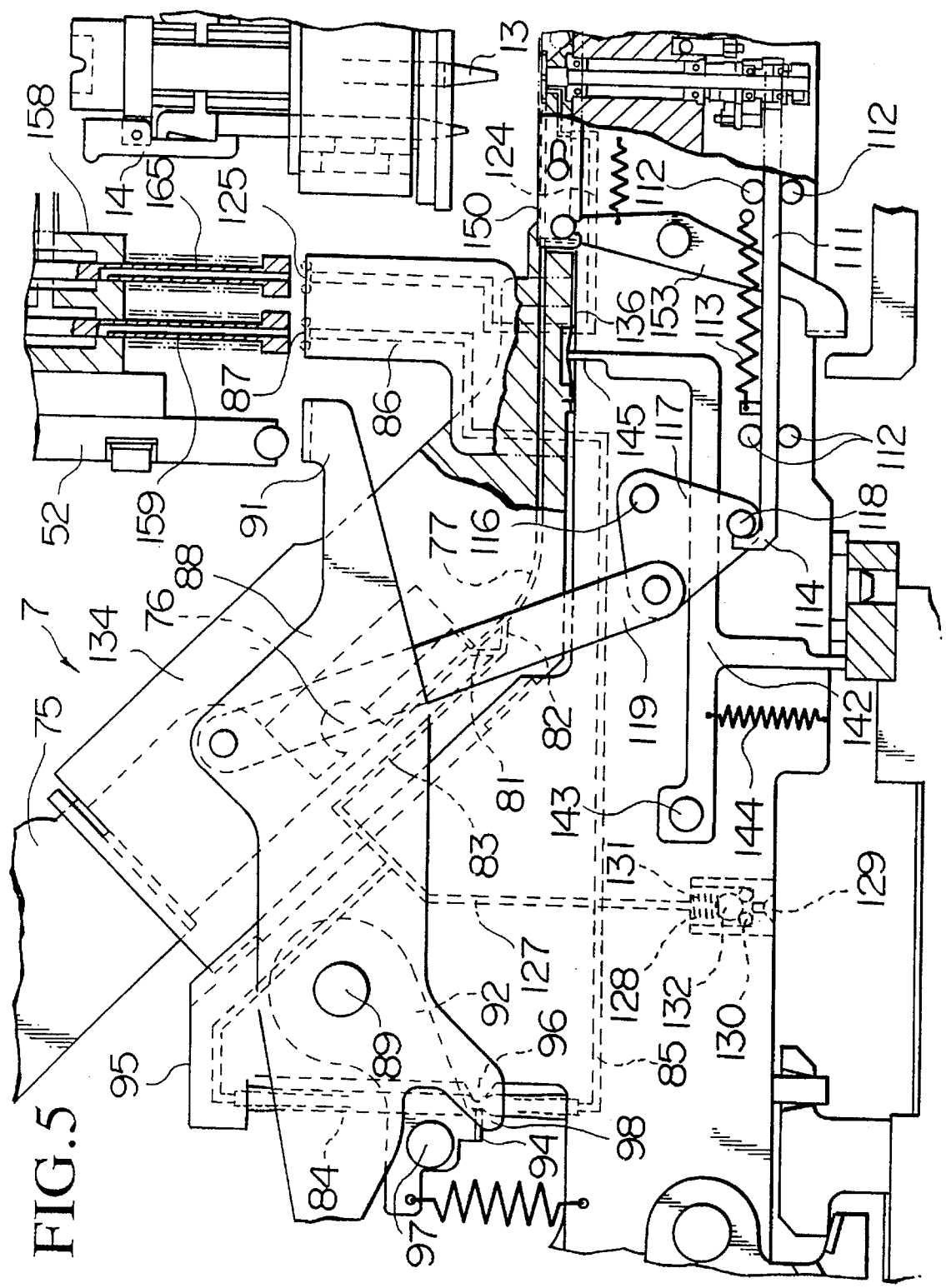
FIG. 5 is an enlarged sectional view of the main part of the parts feed unit.

Referring to FIGS. 1 and 5, a bulk case indicated at 75 for storing chip parts 4 in a separate condition is mounted detachably to the upper portions of parts feed unit 7. Parts 4 in said bulk case 75 fall down via a chamber indicated at 76 to align in a shoot indicated at 77, and are fed to a rotor indicated at 101 described below for separating parts 4 to be picked up by the suction nozzle 13.

Parts feed unit 7 is positioned by inserting a pin for attachment indicated at 78 provided before and behind of the lower portion thereof into a hole for attachment 79 provided on the feed table 6, and mounted on the feed table 6.

A mechanism for feeding parts 4 aligned in the shoot 77 will now be described.

81 indicates a chamber compressed air feed hole as an air jet passage provided at the lower part of the chamber indicated at 76 as a storeroom for parts, and 82 indicates shoot compressed air feed hole as an air jet passage provided at the entrance of the shoot 77. Both feed holes are associated with a compressed air feed passage indicated at 83, and said feed passage 83 is associated with an elastic air tube indicated at 84. Said air tube 84 can shut the compressed air passing through said tube 84 by crushing the air tube 84. Said tube 84 is further connected with a compressed air feed passage indicated at 85. Compressed air fed from a compressed air from feed hole 81 source (not shown) blows off chip parts 4 staying in the chamber 76 so as not to stop at the entrance of the shoot 77. The compressed air spouting from said feed hole 82 serves to move parts 4 aligning in the shoot 77 towards the exit of the shoot 77. Compressed air feed passage 85 is associated with an opening indicated at 87 on the upper face of a connected body indicated at 86 mounted on the upper part of the body 135 described later. In the periphery of said opening 87, there is provided an O-ring in order not to leak the air when the compressed air feed rod indicated at 159 described later is abutted against it.

A valve opening/closing mechanism which opens/shuts the air flow by crushing and restoring said air tube 84 will now be described with regards to FIGS. 1 and 6 to 8.

88 indicates an oscillating lever which oscillates pivotally around a pivot indicated at 89, and is energized to oscillate counterclockwise in FIG. 1 by a tension spring indicated at 90. The right-hand end of the oscillating lever 88 engages with a reciprocating rods 52, 53 and 54 to form an engaging tab indicated at 91 for oscillating said lever 88 clockwise. A lever for a valve indicated at 92 which oscillates pivotally around said pivot 89 is provided on the back side of said lever 88 in FIG. 1, and said lever 92 is also energized to oscillate counterclockwise in FIG. 1 by a tension spring indicated at 93. On said lever 92, there is folded and formed a tube-pushing tab indicated at 94 on the back side in FIG. 8. In the situation shown in FIGS. 1 and 7, a tube-pushing tab 94 puts and crushes a tube indicated at 84 between a tube-pushing projection indicated at 96 formed on the body plate indicated at 95 by means of a force of the tension spring 93 to shut the flow of the compressed air. Furthermore, a cam follower indicated at 97 is mounted on the said lever 92. A push-releasing tab indicated at 98 formed on the oscillating lever 88 engages with said cam follower 94 to oscillate the lever for a valve 92 clockwise against the force of the tension spring 93 by the clockwise oscillation of said lever 88, and moves the tube-pushing tab 94 in the direction leaving from the tube 84. When the tube-pushing tab 94 leaves the tube 84, the tube 84 opens the passage for the compressed air by means of own elasticity and the pressure of the compressed air.

A mechanism for separating chip parts 4 from the shoot 77 will be described with regards to FIGS. 9 to 18.

Figure 11:
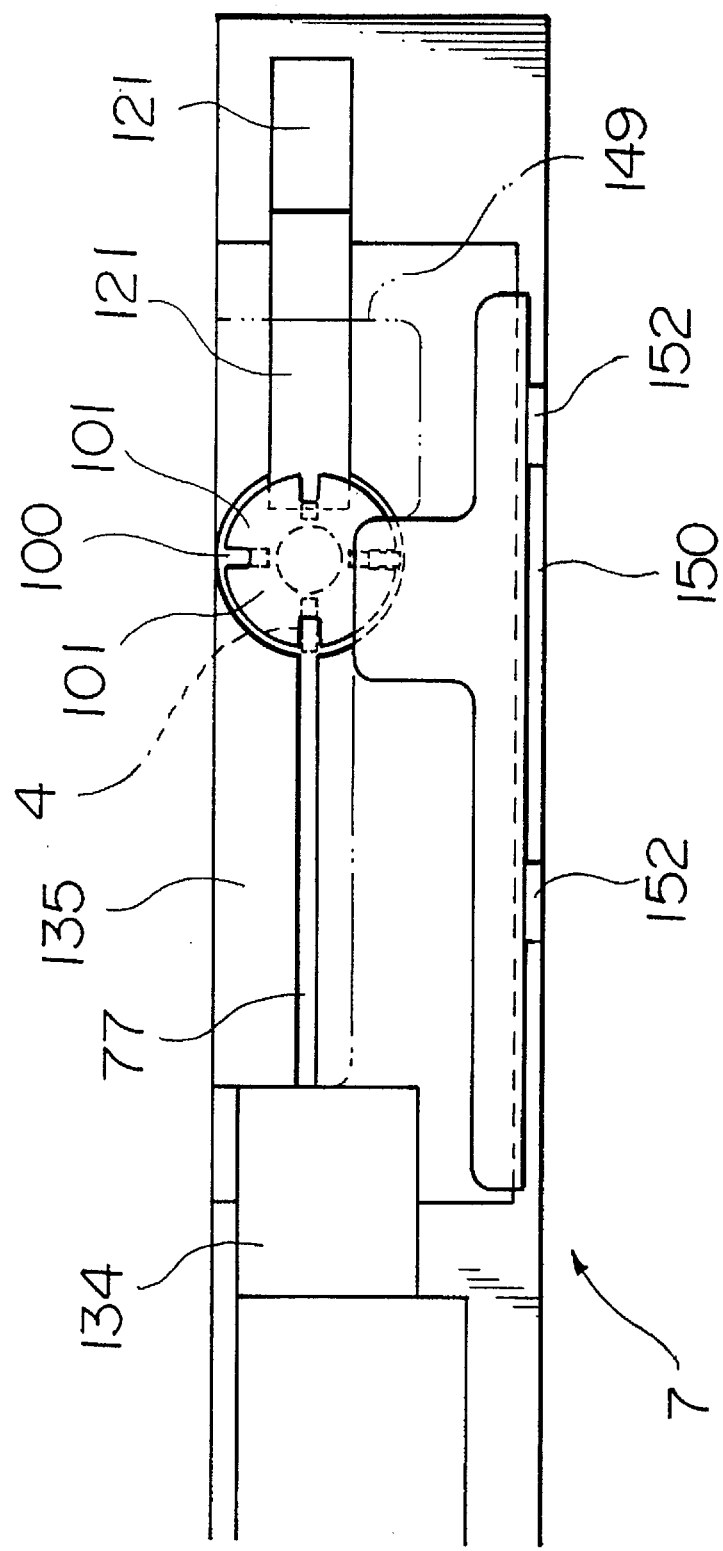
FIG. 11 is a plane view of the parts separating portion of the parts feed unit.
Figure 12:
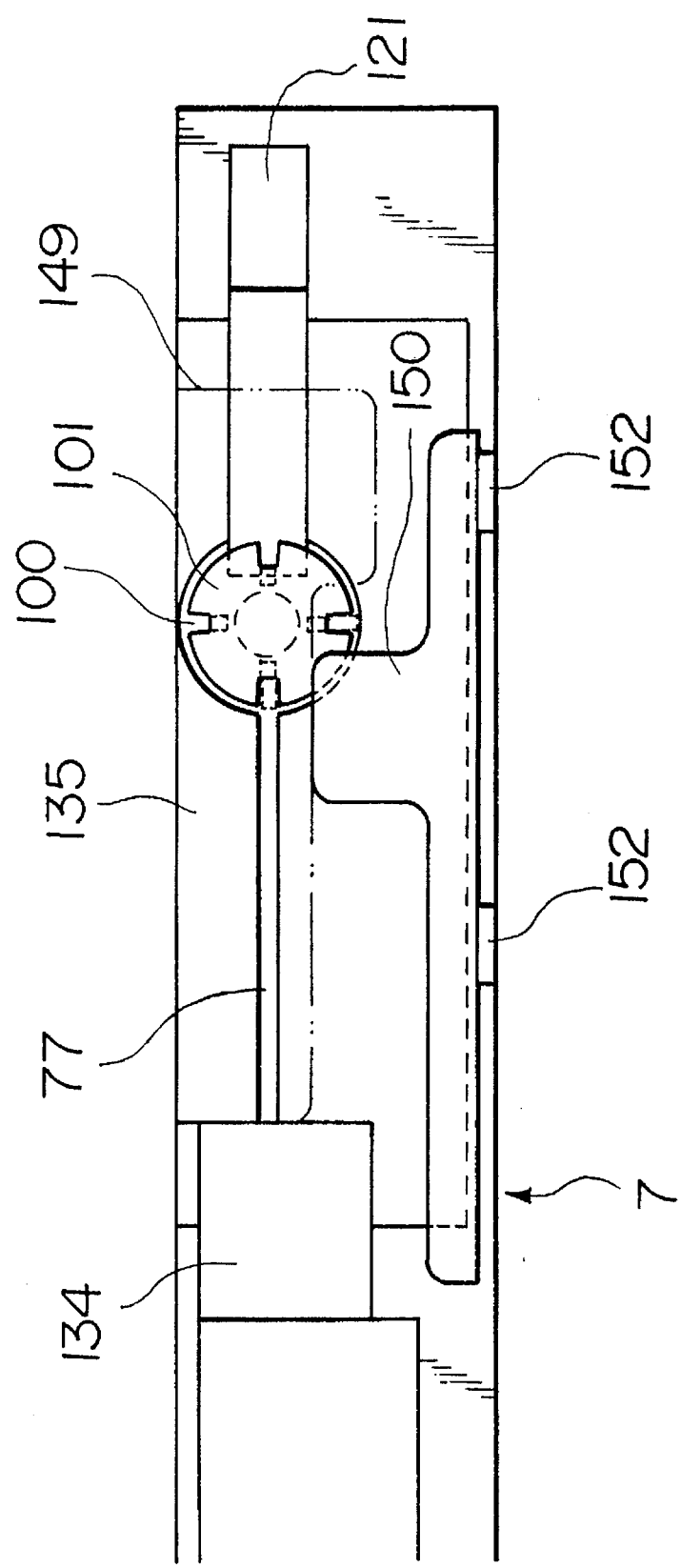
FIG. 12 is a plane view of the parts separating portion of the parts feed unit.
Figure 13:
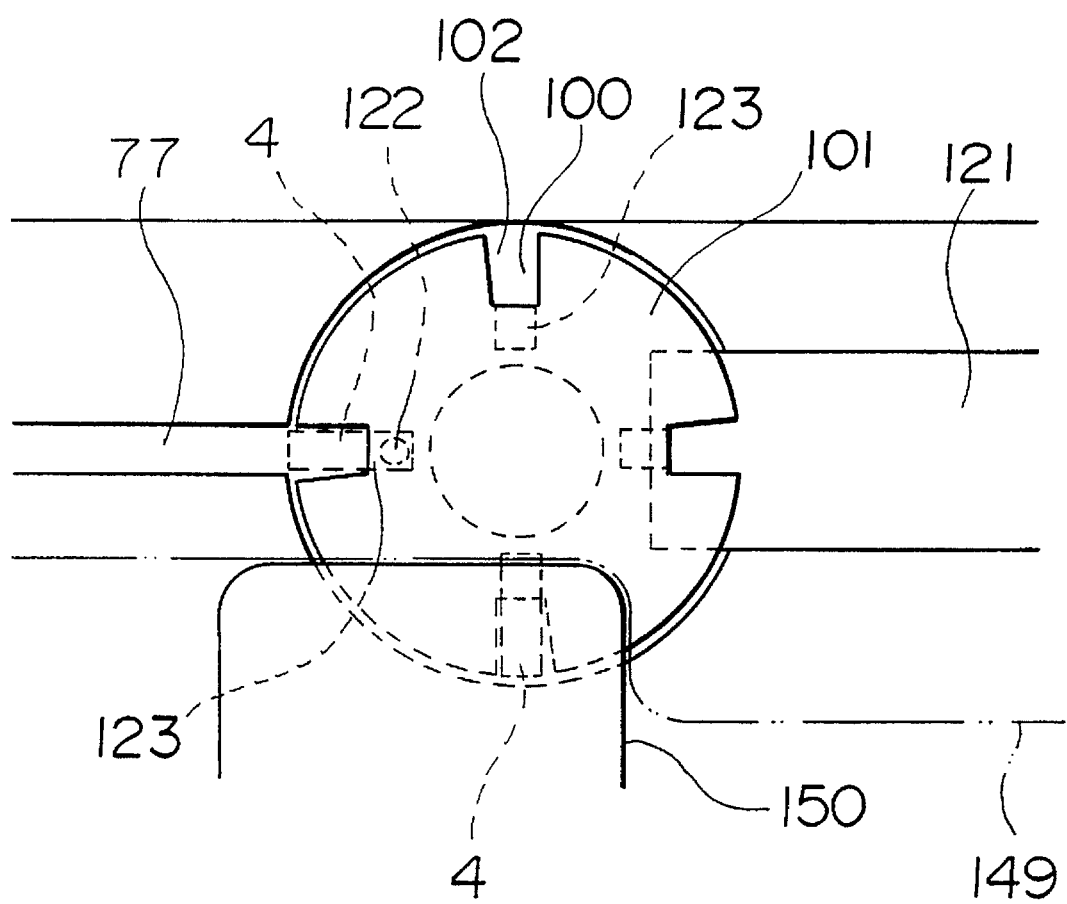
FIG. 13 is an enlarged plane view of the parts separating portion of the parts feed unit.

At the exit of the shoot 77, there is provided a rotor indicated at 101 in which a groove indicated at 100 is notched for parts 4 entering therein at an interval of 90° as shown in FIGS. 11 to 13. The width of the rotor 101 in the rotation direction, which is a frontage of said groove 100, is formed a little wider than the width of parts 4. Parts 4 guided through the shoot 77 are pushed by the succeeding parts and stored in the groove 29 positioned at the exit of the shoot 77. Said parts 4 are located on the mounting surface of the chip parts indicated at 102 in a groove indicated at 77, and when the rotor 101 rotates, the parts 4 slide and move on said mounting surface 102.

When parts 4 are fed to the groove indicated at 100, the forefront part 4 is separated from other parts 4 in the shoot 77 by rotating at 90° counterclockwise in FIG. 13 and stopping thereto, and the next groove 100 locates at the exit of the shoot 77, and a part 4 is similarly fed to the groove 100.

A mechanism which intermittently rotates the rotor 101 will be described.

Referring to FIG. 9 to 18, 103 indicates a rotor axis on which the rotor 101 is pivotally mounted. A pinion indicated at 104 is rotatably inserted to the lower portion of said rotor axis 103 independent of the rotation of the axis 103. To the upper portion of said pinion 104, a ratchet bracket indicated at 105 which rotates with said pinion is inserted.

In the upper portion of said ratchet bracket 105, a ratchet wheel indicated at 106 which rotates integrally with the rotor axis 103 is pivotally mounted to the axis 103. A latchet claw indicated at 108 mounted in the ratchet bracket 105 engages with the wheel groove indicated at 107 formed at 90° intervals in the periphery of the ratchet wheel 106. A ratchet lock claw indicated at 110 is energized by a spring (not shown) to oscillate and engage with the groove 107 of the ratchet wheel 106 so that the ratchet wheel 106 does not rotate to the reverse direction.

Figure 9:
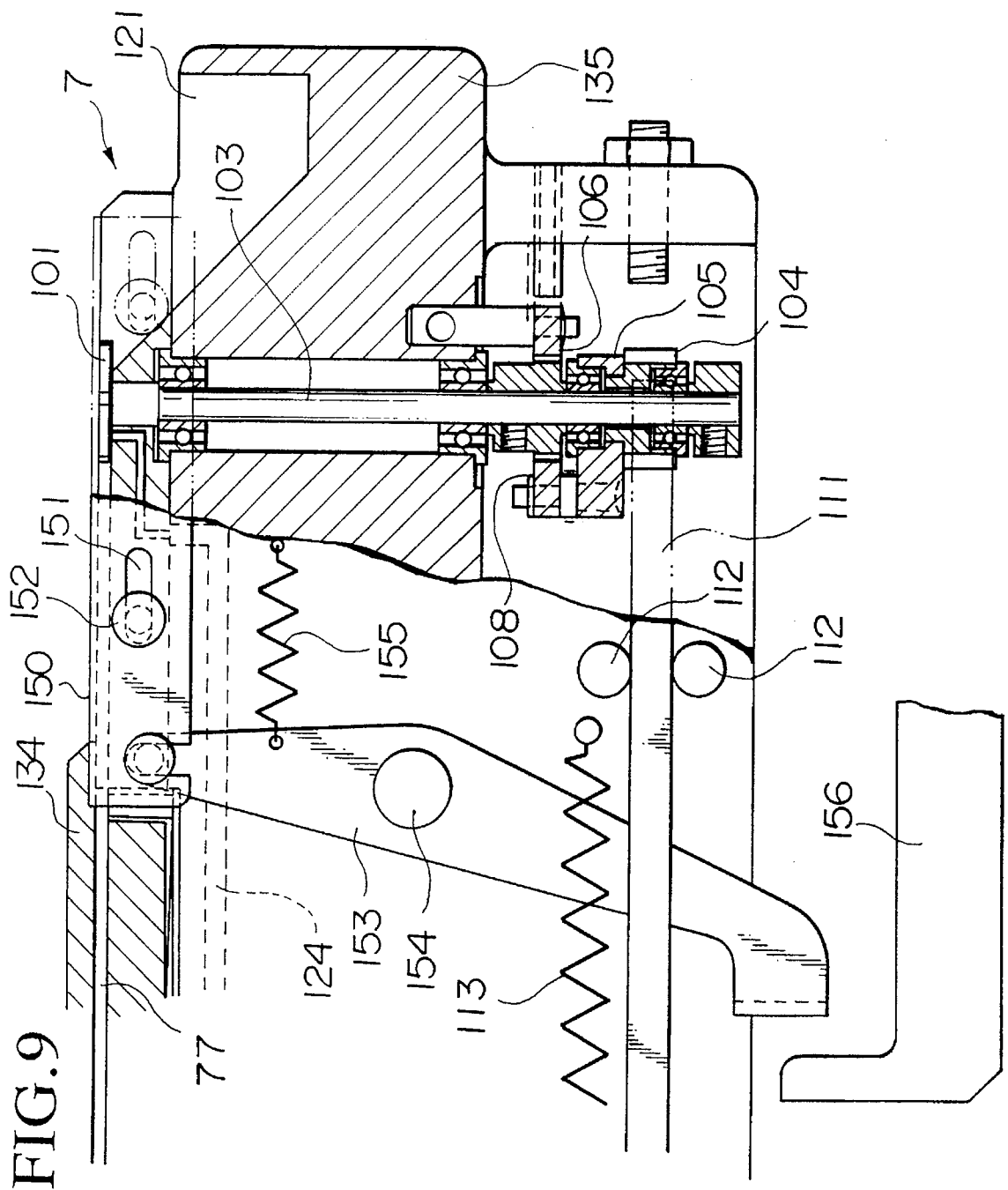
FIG. 9 is a side view of the parts separating portion of the parts feed unit.

A rack indicated at 111 is fitted to said pinion 104 to rotate the pinion 104 and guided by a guide roller indicated at 112 to reciprocate, and is always energized by a tension spring indicated at 113 towards the right direction in FIGS. 1 and 9. At the left-hand end of the rack 111 in FIG. 1, a regulating tab indicated at 114 is formed to engage with a cam follower indicated at 118 mounted in an oscillating plate indicated at 117 which oscillates pivotally around a pivot indicated at 116 to regulate the movement of the rack 111 to the right direction.

Figure 6:
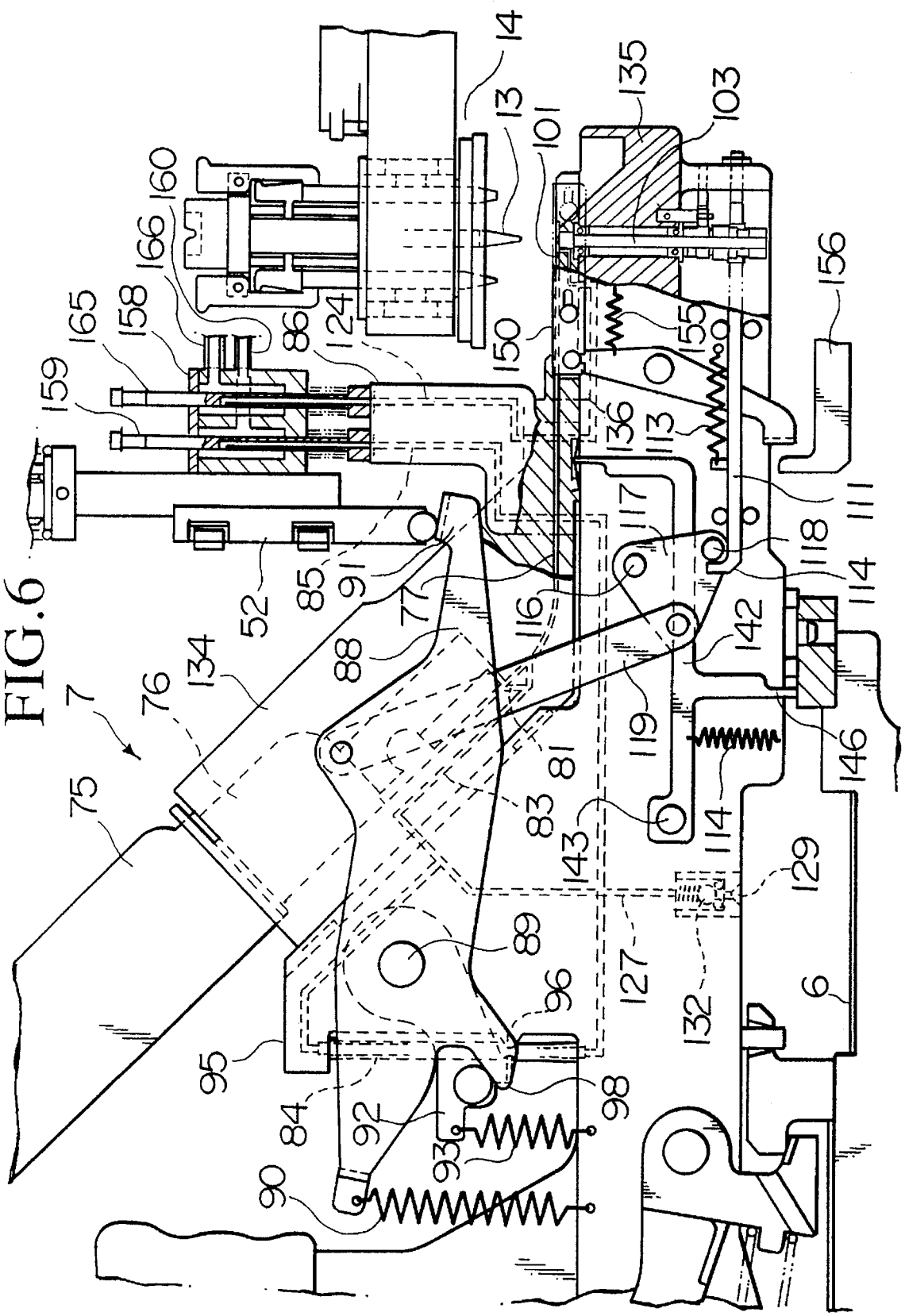
FIG. 6 is an enlarged sectional view of the main part of the parts feed unit.

The oscillating plate 117 is connected to said oscillating lever 88 by a link lever indicated at 119. When said lever 88 oscillates clockwise in FIG. 1 by downward movement of the reciprocating rods 52, 53 and 54, the oscillating plate 117 oscillates counterclockwise as shown in FIG. 6, and said rack 111 moves towards right direction to rotate the rotor axis 103 via said pinion 104 and said ratchet wheel 106, thereby the rotor 101 mounted to the rotor axis 103 rotates at 90° counterclockwise of FIG. 13. When the reciprocating rods 52, 53 and 54 rise, the oscillating lever 88 and oscillating plate 117 return to the positions in FIG. 1, but the ratchet wheel 106 retains the rotating position by the ratchet lock claw 110 and the rotor 101 keeps the rotating position. Accordingly, every time the reciprocating rods move downwards, the rotor rotates intermittently at 90°.

Respective stop positions of the rotor 101 by the intermittent rotation will be described with regards to FIGS. 11 to 13.

The stop position of the groove 100 in which the parts 4 are fed by the shoot 77 is referred to as a "chip separating station". Chip parts 4 in said station are separated from the shoot 77 by a rotation of the rotor 101.

At the stop position where the rotor 101 intermittently rotates one time, that is, rotates by 90° counterclockwise from the chip separating station, vacuum suction of the chip parts 4 is carried out by the suction nozzle 13, and this stop station is referred to as a "chip sucking station".

The next stop position of the groove 100 by the rotation of the rotor 101 is a "discharge station of chips which fail to be sucked". The chip parts placing face 102 at the lower part of the groove 100 in said station opens for forming a discharged chip storeroom indicated at 121, and chip parts 4 which have not been sucked fall to be discharged. If they are not discharged, they may be caught by the shoot or the forefront chip part 4 aligned in the shoot 77 in the chip separating station.

A structure in which chip parts 4 stored in the groove 100 in the chip separating station are vacuum sucked toward the center of the rotor 101 will be described with regards to FIGS. 9 to 14.

In the chip parts placing face 102 of the chip separating station, a vacuum hole indicated at 122 for sucking the chip parts 4 towards the center of the rotor 101 opens, and connected with a groove-circulating hole indicated at 123 which is formed in the position adjacent to the groove 100 at the lower face of the rotor 101. The reason why the chip parts 4 are sucked towards the center by the vacuum hole 122 is that separation of the chip parts 4 from the shoot 77 is assured and chip parts 4 do not strike against the exit of the shoot 77 in the chip separating station.

The vacuum hole 122 is opened in the chip parts placing face 102 by a vacuum passage indicated at 124. Vacuum passage 124 passes through the connected body 86 as shown in FIGS. 1, 5 and 6, and is connected with a vacuum opening indicated at 125 formed adjacent to the opening on the upper face of the connected body 86. In the periphery of the vacuum opening 125, there is also provided an O-ring.

Figure 19:
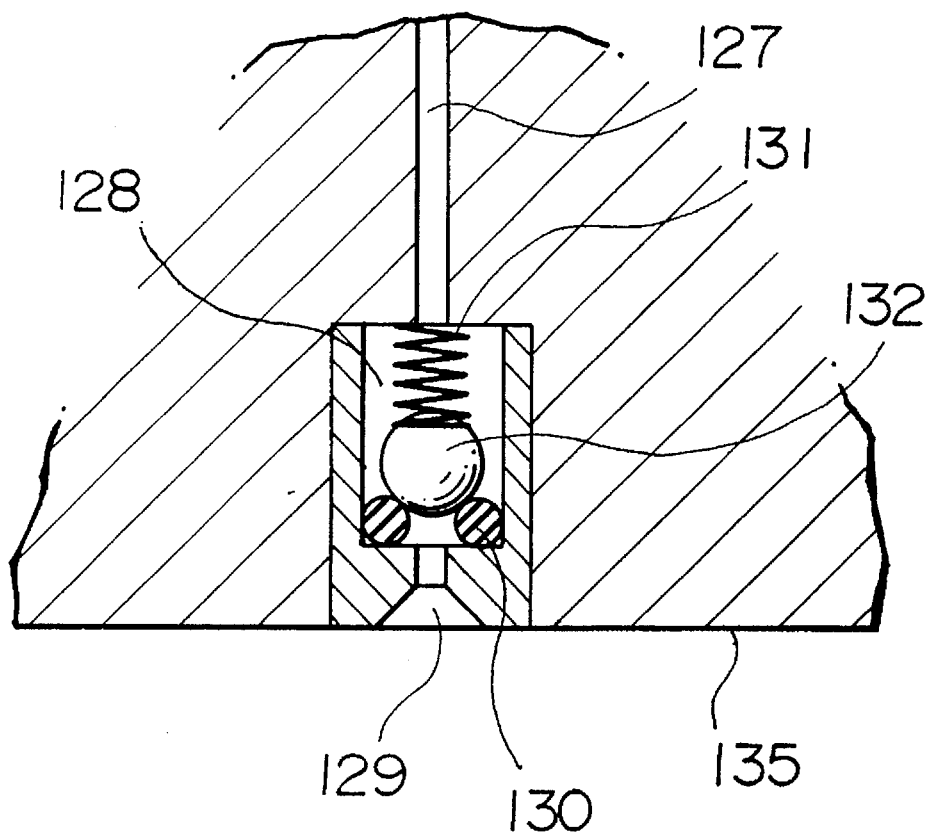
FIG. 19 is an enlarged side view showing a mechanism which feeds compulsorily the compressed air of the parts feed unit.

A mechanism which feeds forcibly compressed air in the compressed air feed passage indicated at 83 will be described with regards to FIGS. 5, 6 and 19.

127 indicates an air compulsory feed passage connected with a compressed air feed passage 83, and the other end thereof is connected with an air compulsory feed room indicated at 128. An air compulsory feed opening indicated at 129 opens at the other end of the air compulsory feed room 128. In the opening 129 side of the feed room 128, O-ring indicated at 130 is provided in the periphery of said opening 129, and it prevents the compressed air in the feed passage 127 from leaking into the open air by pushing a ball indicated at 132 to said ring 130 by means of the force of the compression spring indicated at 131. When the compressed air is blown from the air compulsory feed opening 129 by means of an air gun and the like, the ball 132 is pushed by the pressure towards the air compulsory feed passage 127 against the force of the spring 131 to leave from the O-ring 130, thereby the compressed air flows into the feed passage 127 via the feed room 128 to be spouted into the shoot 77 from the feed holes 81 and 82 via the feed passage 83.

A mechanism which shuts the shoot 77 en route to prevent the reversion of the parts 4 towards the chamber 76 will be described with regards to FIGS. 20 and 21.

The parts feed unit 7 consists of a cassette portion indicated at 134 having said bulk case 75, chamber 76 and a portion connected with the chamber 76 of the shoot 77, and the body indicated at 135 to which said cassette portion 134 is mounted. Therefore, the shoot 77 and the compressed air feed passage 85 is connected en route between the cassette portion 134 and the body 135.

The chamber 76 of the cassette portion 134 and the shoot 77 have a transparent plate mounted to the portion shown in FIGS. 1, 5 and 6 from one side to confirm the alignment condition of the chip parts 4 in the shoot 77.

Figure 20:
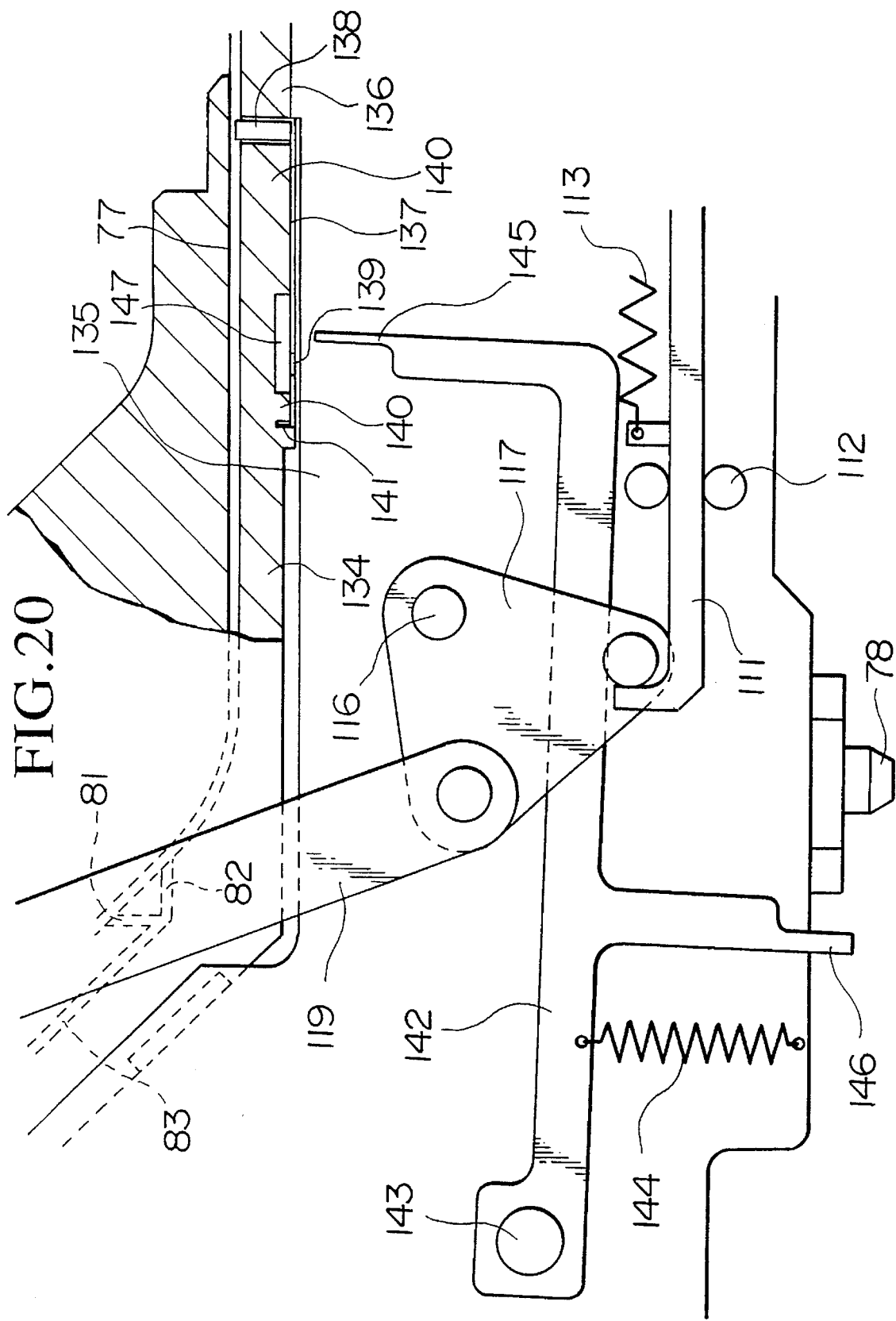
FIG. 20 is a side view showing a mechanism which cuts off the shoot en route of the parts feed unit.

136 indicates a cutoff board which is provided for interrupting the exit of the cassette portion 134 of the shoot 77, which is composed of a wide spring board indicated at 137 in the vertical direction of FIG. 20, and a restraining board indicated at 138 at the right-hand end thereof having a thickness (the similar thickness with that of the spring board 137 shown in FIG. 20) which can be inserted into the shoot 77 in the vertical direction to the paper face of FIG. 20 which is folded vertically forward from said spring board 137 and formed upright. The spring board 137 of said cutoff board 136 is supported from the bottom by a pushing tab indicated at 139 which extends vertically to the paper face of FIG. 20 at the lower end of the cassette portion 134, and is retained between said pushing tab 139 and a pushing face indicated at 140 formed at the lower end of the cassette portion 134. The light-hand end of the spring board 137 is folded vertically as shown in FIG. 20 to form a projecting tab indicated at 141, which enters into the regulating groove formed in the lower face of the cassette portion 134 to prevent the cutoff board 136 slipping out of the position in right and left directions. The tip portion of the shoot 77 of the cassette portion 134 has a groove formed on the lower face thereof having a width into which said restraining board 138 can be inserted. The restraining board 138 pushes the chip parts 4 aligned in the shoot 77 from the downward direction in the condition shown in FIG. 20, and it prevents chip parts 4 before and behind this position from moving this position.

142 indicates a cutoff board release lever which can oscillate pivotally around a pivot indicated at 143, and rotates clockwise by the force of the tension spring indicated at 144. The release lever 142 has a release pin indicated at 145 and a restraining pin indicated at 146. In the condition where the parts feed unit 7 is mounted on the feed table 6, as shown in FIG. 21, the restraining pin 146 is pushed toward the upper face of the feed table 6 to oscillate said lever 142 counterclockwise, and a release pin 142 pushes the spring board 137 to put it into the concave portion indicated at 147 formed in the pushing face 140. As the result, the restraining board 138 moves downwards to release from interrupting the movement of the chip parts 4 in the shoot 77.

A cover indicated at 149 which covers the upper portion of the shoot 77 and a shutter indicated at 150 which covers the upper portion of the chip sucking station will be described with regards to FIGS. 9 to 12.

Cover 149 is to cover the upper portion of the shoot 77, chip separating station, discharge station of chips which fail to be sucked and the rotation stop position of the subsequent rotor 101, since the upper portion of the shoot 77 of the body 135 following to the cassette portion 134 is opened, and has a configuration shown by a two-dot chain line in FIGS. 11 and 12. Said cover 149 can rotate pivotally around a pivot (not shown) formed above the shoot 77 in FIGS. 11 and 12 which is parallel to the shoot 77, and the upper part of the shoot 77 can be opened by opening the cover.

Shutter 150 has pins indicated at 152 fitted thereto which project from the body 135 toward a long hole indicated at 151 provided in the shutter 150. Said shutter 150 slides on the chip sucking station to open and close it. Said station is covered by the shutter 150 except when the chip parts 4 is sucked by the suction nozzle 13. The opening/closing of the shutter 150 is carried out by oscillating the shutter lever indicated at 153, one end of which engages with the shutter 150, pivotally around the shutter pivot indicated at 154. It is a tension spring 155 energizing said lever 153 to rotate clockwise and a shutter drive lever indicated at 156 provided on the body (parts other than the feed table 6) of automatic electronic parts mounting device which rotates said lever 153 against the force of said spring 155 that drive the shutter lever 153.

A mechanism which feeds compressed air and vacuum pressure to said compressed air feed passage 85 and said vacuum passage 124 from the compressed air source (not shown) provided on the body (parts other than the feed table 6) of the automatic electronic parts mounting device will be described with regards to FIGS. 1, 3, 22 and 23.

An air-pressure feed block indicated at 158 is mounted as an attaching/detaching means to said reciprocating rods 52, 53 and 54, respectively. A compressed air feed rod indicated at 159 is provided as an air feed means which reciprocates vertically through said block 158. In said block 158, a compressed air room indicated at 161 is formed to which the compressed air is fed from the compressed air source (not shown) via the compressed air feed tube indicated at 160, and said rod 159 passes through said air room 161. On the lower end face of said rod, an air hole indicated at 162 opens, passes through the rod 159 and is connected with the opening indicated at 163 on the side face of the rod 159. Said rod 159 is always energized to descend against said block 158 by the compression spring indicated at 164.

165 indicates a negative-pressure feed rod as a vacuum pressure feed means which reciprocates vertically through said block 158, and vacuum is fed (i.e., is vacuum-sucked) from the vacuum source (not shown) via a negative-pressure feed tube indicated at 166 formed in said block 158. A negative-pressure room indicated at 167 is formed and said rod 165 passes through said negative-pressure room 167. On the lower end face of said rod 165, an air hole indicated at 168 opens, passes through the rod 165 and is connected with the opening indicated at 169 on the side face of the rod 159. Said rod 165 is always energized to descend against said block 158 by the compression spring indicated at 170.

The openings 163 and 169 are covered with a wall face in the block 158 in the condition that rods 159 and 165 project downward by the force of springs 164 and 170, and air holes 162 and 168 are not connected with the compressed air source and vacuum source.

Figure 23:
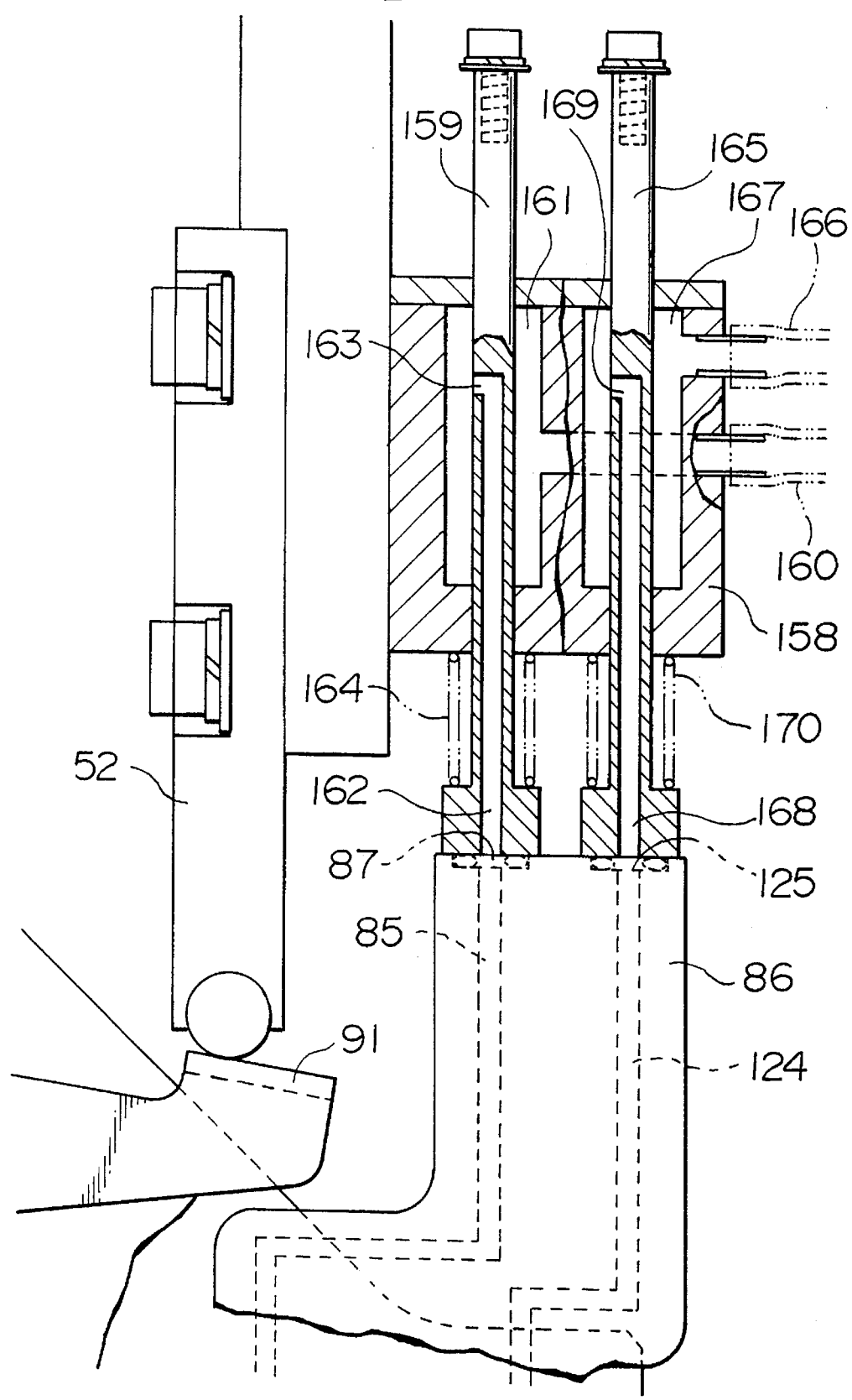
FIG. 23 is a side view showing a mechanism which feeds the compressed air and vacuum pressure to the parts feed unit.

Said rods 159 and 165 descends as the reciprocating rods 52, 53 and 54 descend, and are connected respectively abutting to the position of openings 87 and 125 on the upper face of the connected body 86 of the parts feed unit 7 in the parts sucking position or the position where the reciprocating rods 53 and 54 locate. By the downward movement after abutment, the openings 163 and 169 are respectively circulated with the compressed air room 161 and negative pressure room 167 as shown in FIG. 23.

The position of the openings 87 and 125 of each parts feed unit 7 is located to the position where the openings are connected with the air holes 162 and 168 of rods 159 and 165 mounted to the reciprocating rods 52, when each parts feed unit 7 stops at the parts sucking position.

Operation will be described based on the above-mentioned structure.

In operation, an operator arranges corresponding parts feed units 7 on the feed table 6 by the kind of the printed substrate 5 on which parts 4 are to be mounted. It is necessary to align and feed chip parts 4 in the shoot 77 of parts feed unit 7 to be arranged or in the chip separating station of the rotor 101.

Therefore, in case of the parts feed unit 7 to which the cassette portion 134 is not mounted to the body 135, the cassette portion 134 is first mounted to the body 135. Even in the case where a few of chip parts 4 are aligned in the shoot 77 of the cassette 134, the cutoff board 136 is in the condition in FIG. 20, and the cassette portion can be mounted to the body without parts 4 flying out from the exit of the shoot 77.

Next, with the parts feed unit 7 being removed from the feed table 6, the operator let the compressed air blow out intermittently by pushing an air gun and the like which blows out the compressed air to the air compulsory feed opening 129 of the parts feed unit 7 in the condition that the cassette portion 134 is mounted. Usually, an air gun does not blow out air, but it blows out the compressed air by pulling a lever and the like, thereby compressed air can be blown out intermittently.

Since the parts 4 have not yet been fed to the exit of the shoot 77, operator pushes the restraining pin 146 by hand or by using suitable tools to let the release pin 145 push the spring board 137 to the concave portion 147, and let the restraining board 138 descend from the shoot 77. By the intermittent blowing-out of the compressed air, compressed air is blown out from the feed hole 81 and feed hole 82 via the feed opening 129 and feed passage 127 to stir the chip parts 4 in the chamber 76. When the air jet is stopped, new chip parts 4 enter to the shoot 77 and align, and the chip parts 4 aligned in the shoot 77 are pushed out and transferred to the chip separating station of the rotor 101. Operator can check by opening the cover 149 if chip parts 4 are fed to the shoot 77 and the chip separating station, while the condition of alignment can be checked from lateral direction of the shoot 77.

Each parts feed unit 7 is arranged on the feed table 6 after being checked in this manner.

Figure 21:
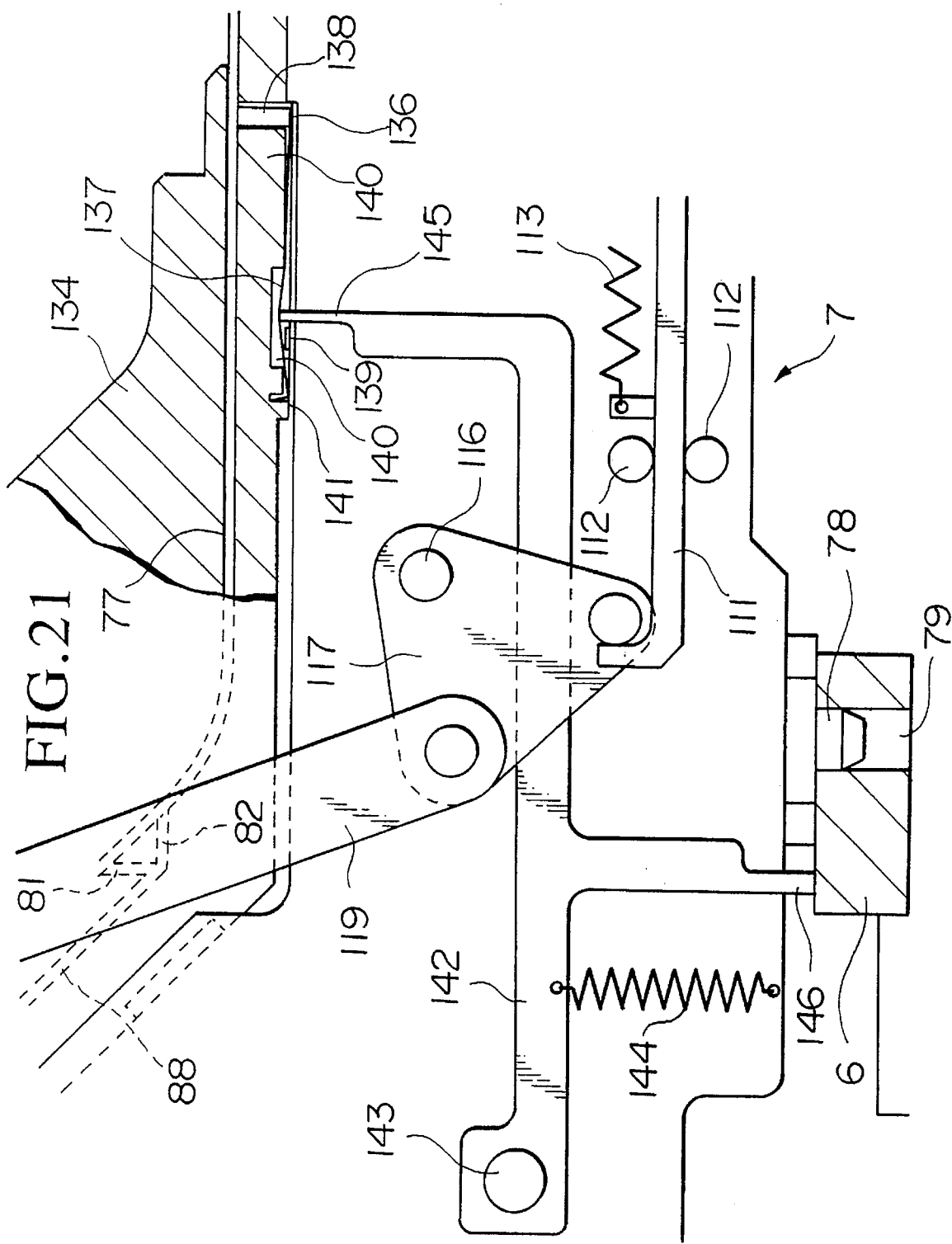
FIG. 21 is a side view showing a mechanism which cuts off the shoot en route of the parts feed unit.
Figure 22:
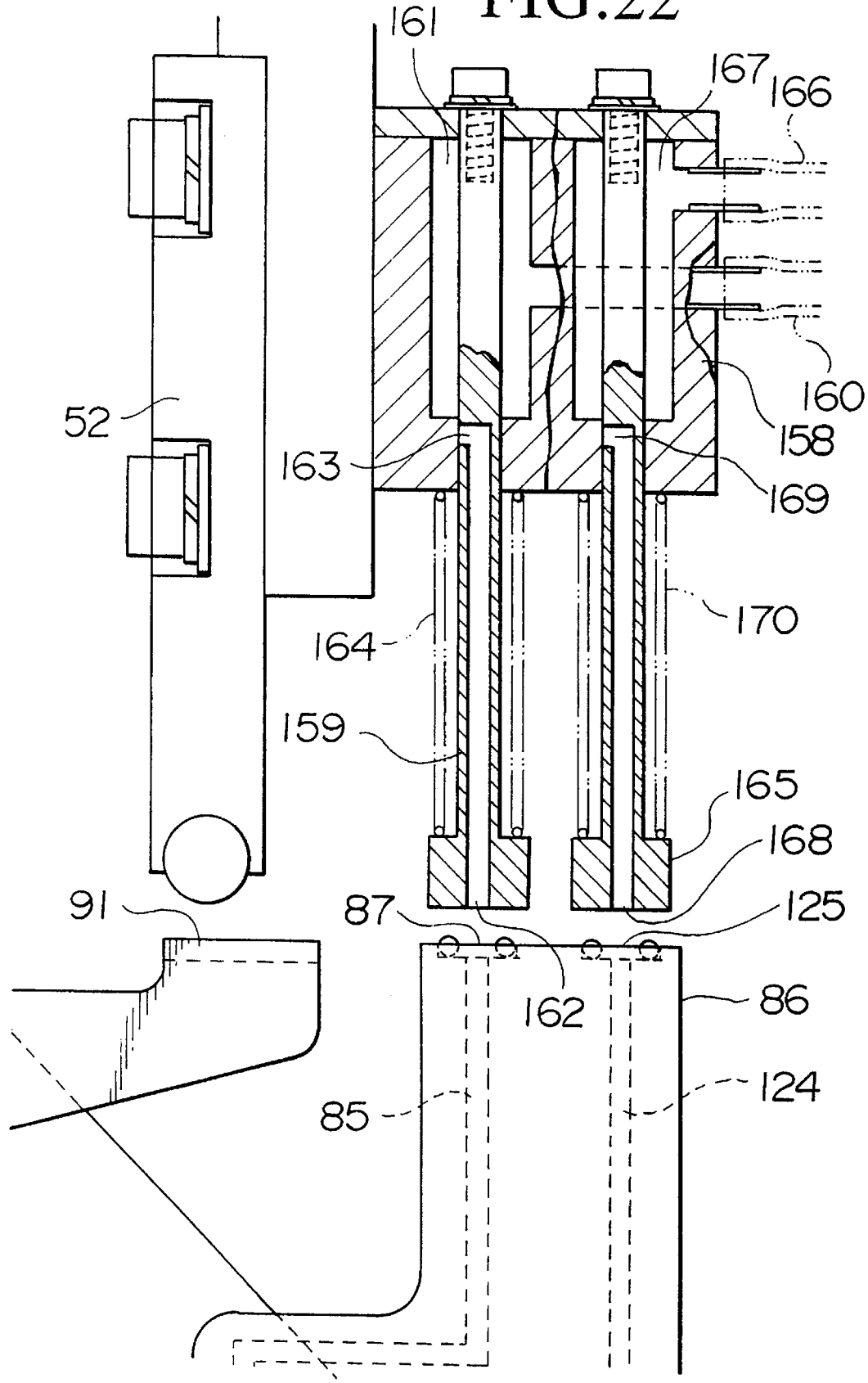
FIG. 22 is a side view showing a mechanism which feeds the compressed air and vacuum pressure to the parts feed unit.

When the parts feed unit 7 is mounted on the feed table 6 by inserting locating pins 78 into the locating holes 79, the restraining pin 146 is pushed to the upper face of the feed table 6, and the release lever 142 oscillates pivotally around the pivot 143 counterclockwise in FIG. 1 to push the spring board 137, and the restraining board 138 is left downwards of the shoot 77 as shown in FIG. 21.

When plurality of parts feed units 7 are mounted on the feed table 6 arranged adjacent to each other, the alignment of parts 4 cannot be confirmed from the lateral direction, and the check becomes difficult by opening the cover 149.

Next, chip parts 4 are sucked by the suction nozzle 13 from the parts feed unit 7 and mounted to the printed substrate 5, which action will be described.

Operator pushes a start switch provided on a control panel (not shown) to start an automatic operation, motor 3 moves to move the feed table 6 so that parts feed units 7 dispensing predetermined parts 4 are moved along the linear guide 11 by means of the ball bearing screw shaft 9 and the nut 10 to the sucking position in the suction station at which the suction nozzle 13 which has been waiting sucks the parts 4. Throughout the movement of the feed table 6, the shutter lever 153 is energized by the spring 155 to rotate clockwise in FIG. 9, and the shutter 150 covers the chip separating station as shown in FIGS. 9 and 11.

When the desired parts feed unit 7 is positioned at the sucking position of the suction nozzle 13, the solenoid (not shown) is energized to allow the oscillating lever 32 to be counterclockwise in FIG. 4 rotated. The cam (not shown) mounted fixedly to the cam shaft 21 counterclockwise in FIG. 4 rotates the oscillating lever 32 from 0° to 180° in FIG.

24. Thereby, the spline shaft 39 moves downwards via the reciprocating rod 33 by the force of the spring 9, and the reciprocating rod 52 moves downwards to engage with the engaging tab 91, and rotates the oscillating lever 88 clockwise in FIG. 1. As said reciprocating rod 52 moves downwards, the block 158 moves downwards, and as shown in FIG. 6, rods 159 and 165 move downward to abut the connected body 86 and to be connected with the feed passage 85 and the vacuum passage 124, respectively. As shown in FIG. 23, by the downward movement of the reciprocating rod 52, rods 159 and 165 move upwards in the block 158 to connect the openings 163 and 169 respectively with the compressed air room 161 and the negative pressure room 167. Compressed air flows into the feed passage 85, and vacuum suction in the vacuum passage 124 is carried out.

Figure 14:
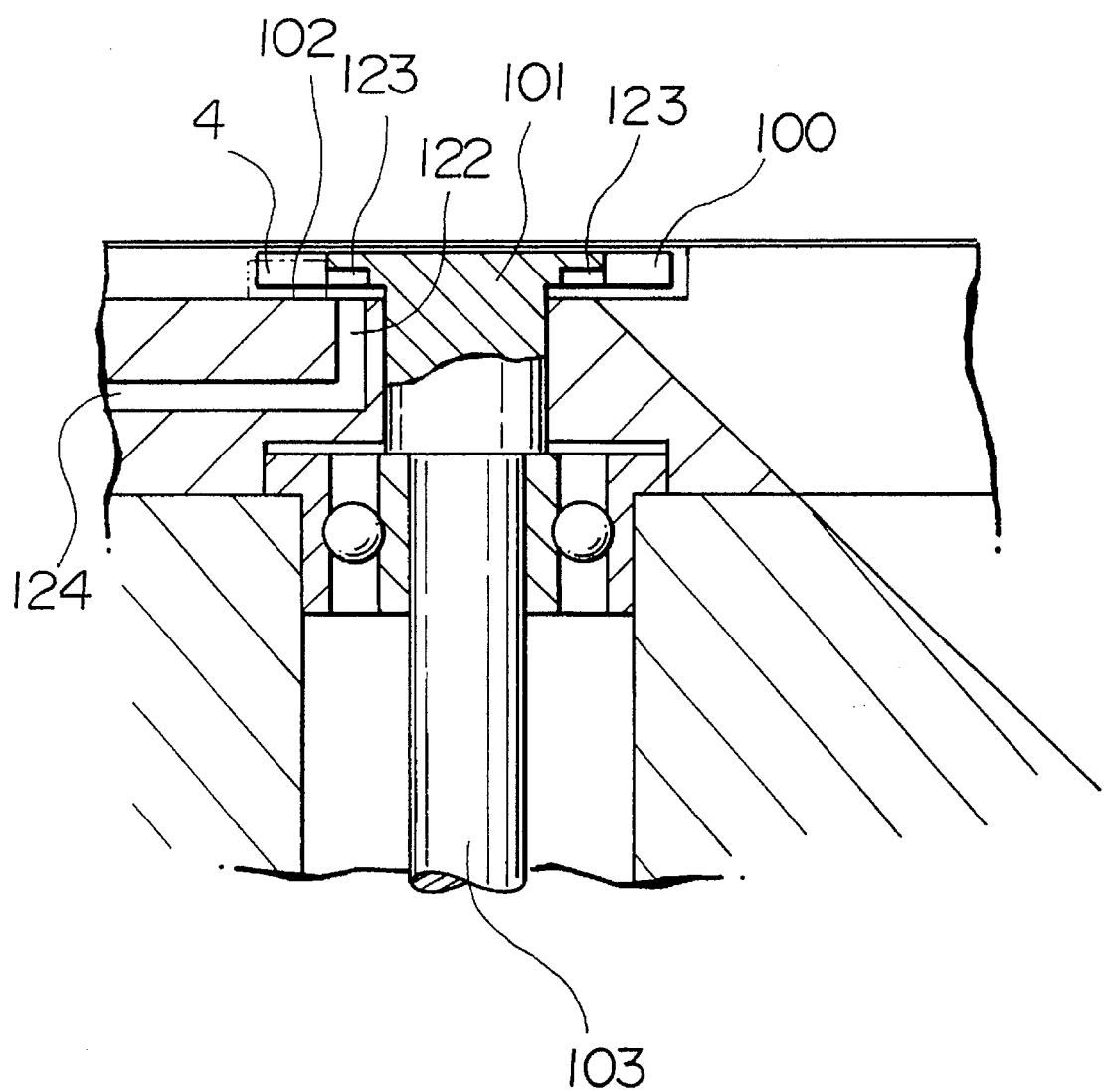
FIG. 14 is an enlarged plane view of the parts separating portion of the parts feed unit.
Figure 15:
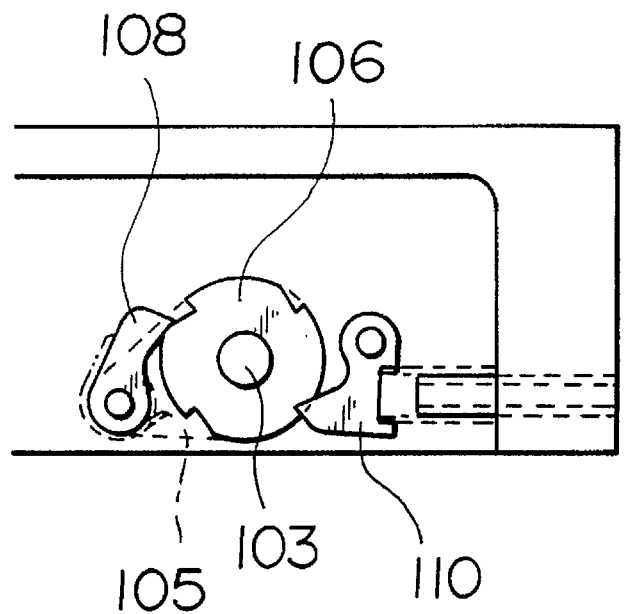
FIG. 15 is a plane view from the downward direction showing the parts separating mechanism of the parts feed unit.
Figure 16:
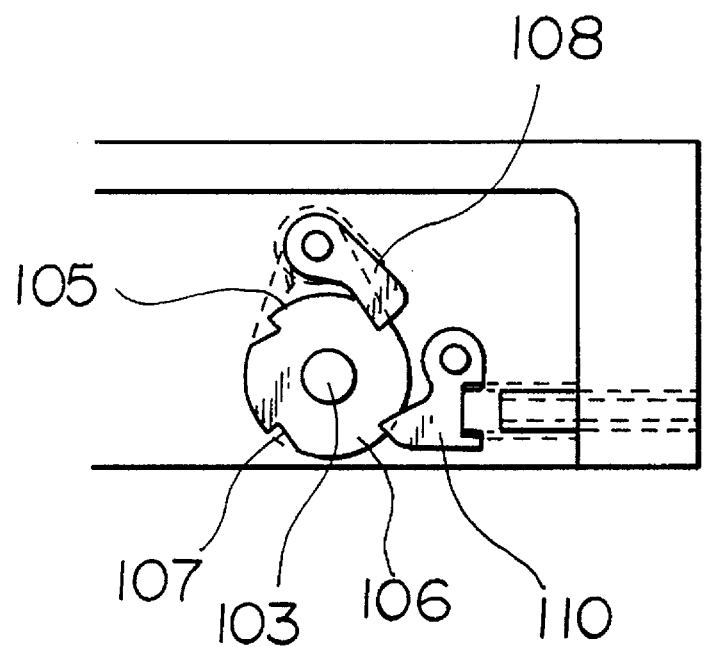
FIG. 16 is a plane view from the downward direction showing the parts separating mechanism of the parts feed unit.

Therefore, as shown in FIGS. 13 and 14, vacuum suction is carried out via the vacuum passage 124 from the vacuum hole 122, chip parts 4 in the groove 100 of the chip separating station is vacuum-sucked towards the center of the rotor 101 via the groove-circulating hole 123.

Figure 7:
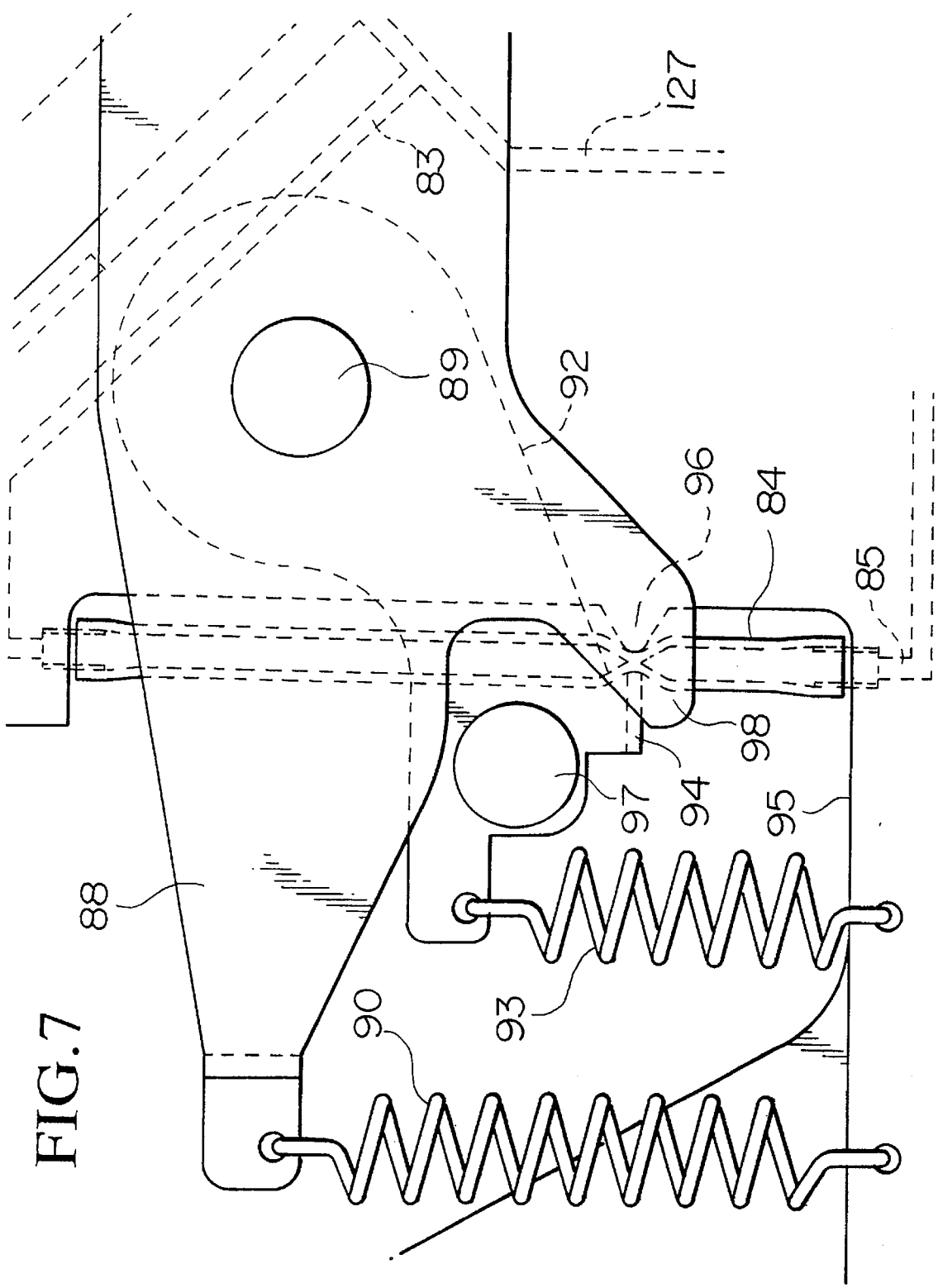
FIG. 7 is a side view showing the valve opening/closing mechanism of the parts feed unit.
Figure 8:
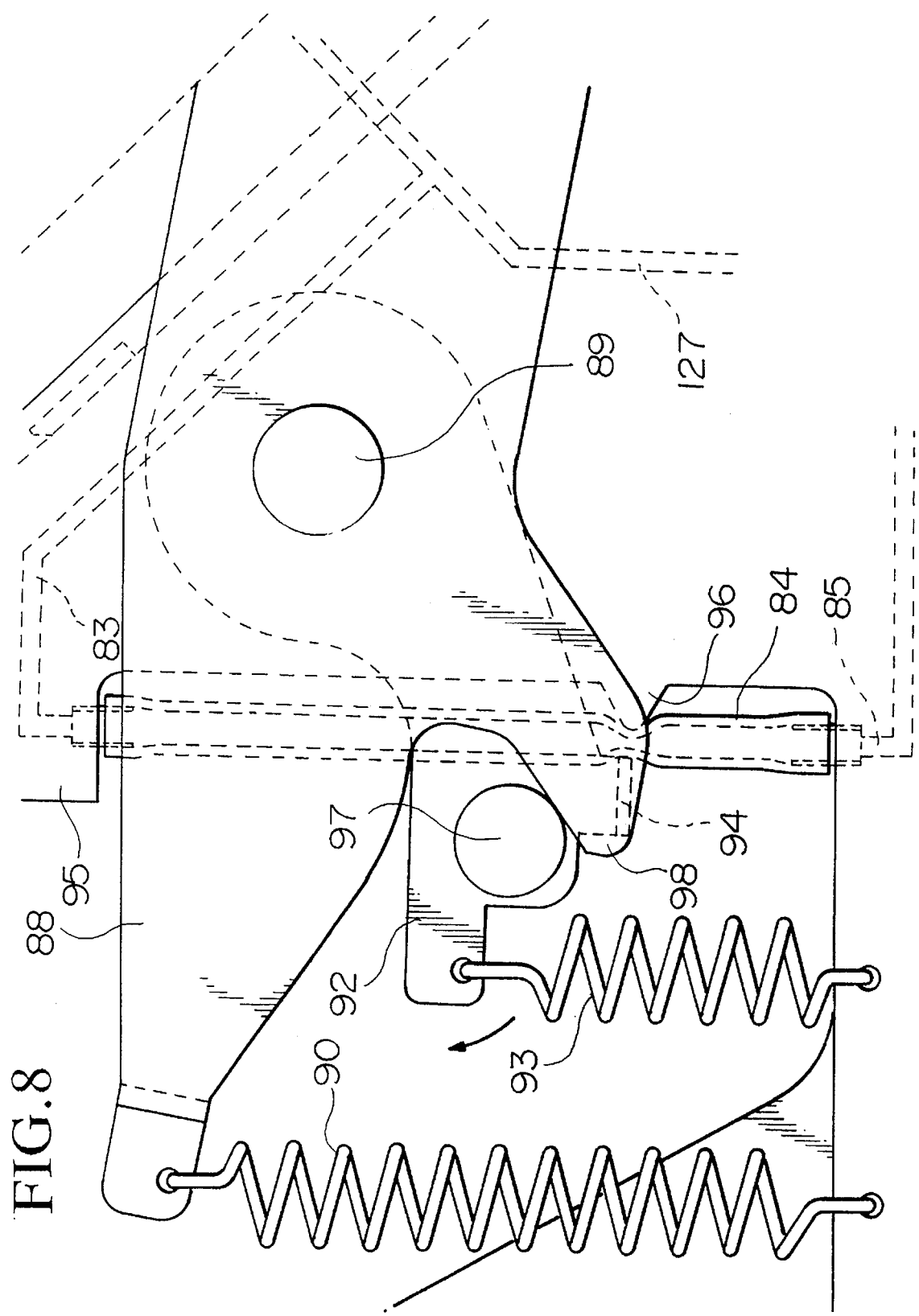
FIG. 8 is a side view showing the valve opening/closing mechanism of the parts feed unit.

On the other hand, when the vacuum suction is started, the push-releasing tab 98 has not been abutted to the cam follower 97, and the lever 88 for the bulk 92 has been in the condition being oscillated counterclockwise of FIG. 1 by the spring 93, and the tube-pushing tab 94 has still been pushing the air tube 84 between the tube-pushing projection 96 and the tube-pushing tab as shown in FIG. 7 to prevent the compressed air from flowing.

Figure 17:
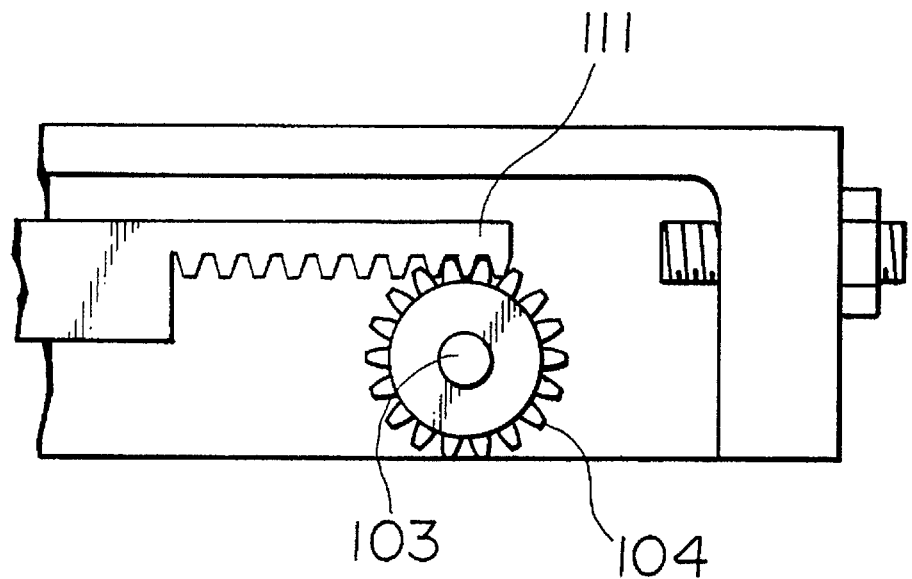
FIG. 17 is a plane view from the downward direction showing the parts separating mechanism of the parts feed unit.
Figure 18:
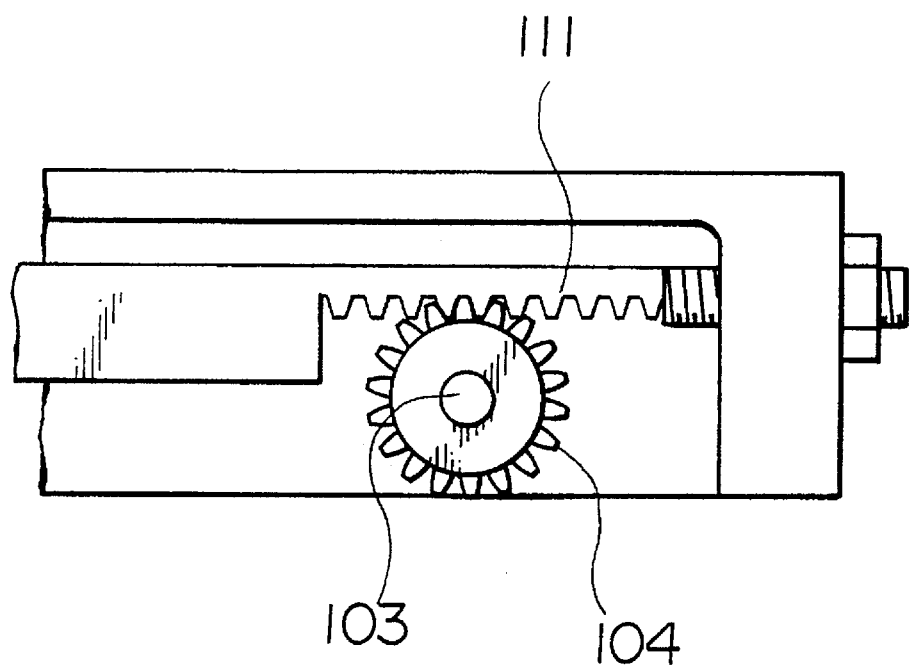
FIG. 18 is a plane view from the downward direction showing the parts separating mechanism of the parts feed unit.

Furthermore, the oscillating lever 88 is moved counterclockwise as shown in FIG. 1 to allow the oscillating board 117 to rotate counterclockwise, and the rack 111 moves to right in FIG. 1 by the force of the spring 113 to rotate the pinion 104 from the condition in FIG. 17 to the condition in FIG. 18. Rotor axis 103 rotates by 90° via the ratchet bracket 105, the ratchet wheel 106 and the ratchet claw 108. Rotor 101 rotates counterclockwise in FIG. 13 by 90° from the condition in FIG. 15 to the condition in FIG. 16, and the chip parts 4 arrive at the chip sucking station and stops. When the rotor 101 rotates, chip parts 4 in the chip separating station are vacuum-sucked from the vacuum hole 122 to prevent them from striking against the chip parts aligned in the shoot 77 or against the exit of the shoot 77, and the cover 149 and the shutter 150 prevent them from flying out.

During the rotation of the rotor 101, the push-releasing tab 98 pushes the cam follower 97 by the rotation of the oscillating lever 88 to rotate the lever 92 clockwise against the force of the tension spring 90. The pushing tab 94 leaves from the projection 96 (see FIG. 8), the air tube 84 opens the flow passage, and the compressed air is spouted from the air feed holes 81 and 82 into the shoot 77 via the air feed passage 83. In this manner, while new chip parts 4 are pushed into the groove 100 located in the chip separating station from the shoot 77, chip parts 4 in the chamber 76 are stirred and aligned in the shoot 77.

During 0° to 180° in the same timing, the cam rotates to move reciprocating rod 52 upwards, and the rotor 101 retains the rotating position by the lock of the lock claw 110 (see FIG. 16), the oscillating lever 88 rotates counterclockwise in FIG. 1 by means of the spring 90. The movement of the releasing tab 98 allows the cam follower 97 to move, and the lever for the valve 92 rotates by the force of the spring 93. The tube-pushing tab 94 pushes the air tube 84 between the pushing projection 96 and the tube-pushing tab as shown in FIG. 7 to cut off the passage of the compressed air to stop the blowing out of the compressed air from the feed hole 81,

82. Furthermore, with the rise of the reciprocating rod 52, the block 158 moves upwards to remove the connection between the opening 87 with the air hole 162 and between the vacuum opening 125 and the air hole 168, and the vacuum suction of the chip separating station is also stopped.

Figure 10:
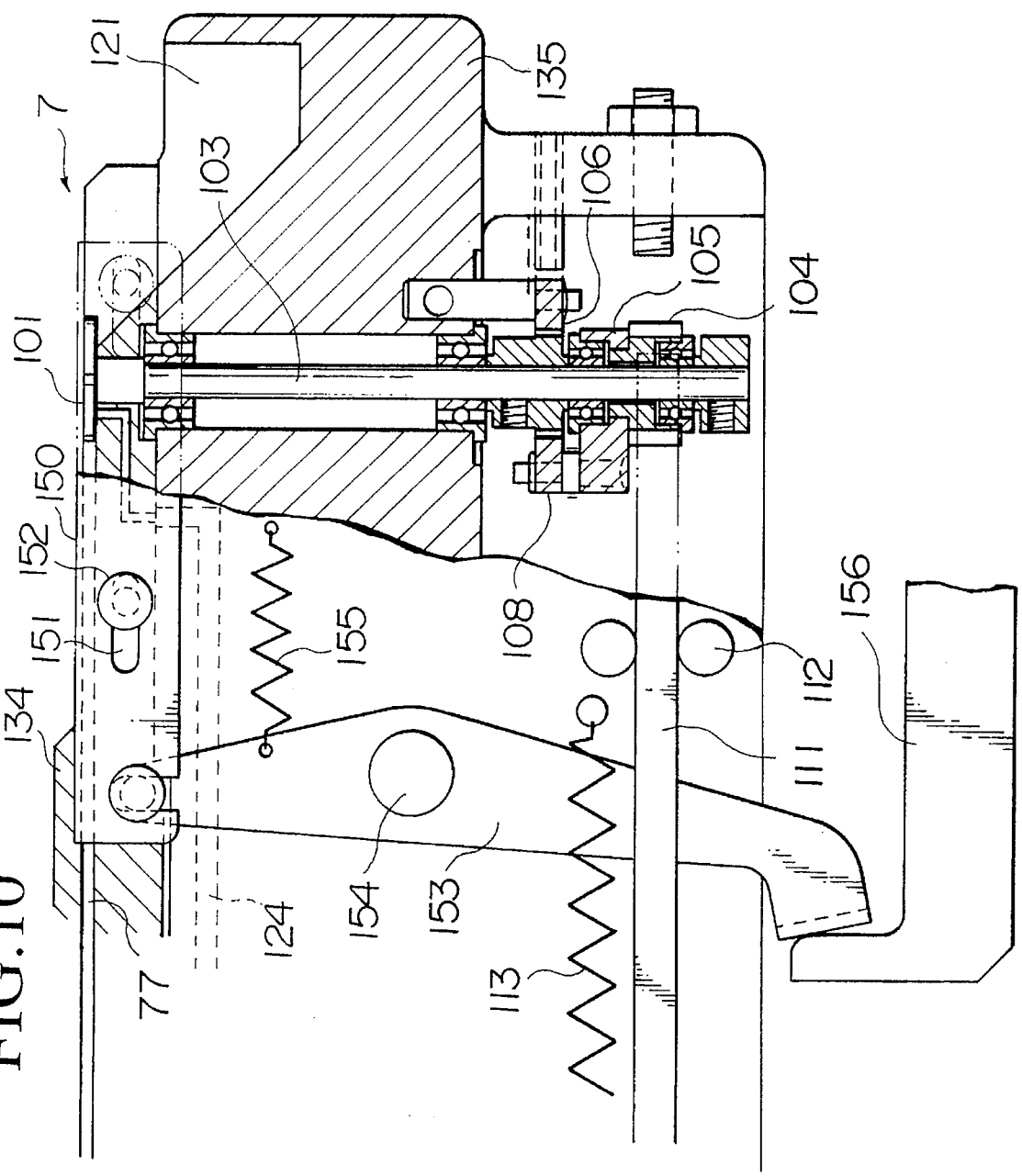
FIG. 10 is a side view of the parts separating portion of the parts feed unit.

From 180° to 360° in the timing chart of FIG. 24, the cam (not shown) rotates to move the shutter drive lever 156 in right direction of FIG. 9, and the shutter lever 153 rotates to move the shutter 150 from the position which covers the chip separating station of FIGS. 9 and 11 to the position of FIGS. 10 and 12 which releases the upper part of said station.

From 180° to 360° in the same timing chart, the cam (not shown) rotates to move the head reciprocating shaft 74 downwards in the turntable 12 and subsequently move the mounting head 14, i.e., the suction nozzle 13 downwards. The suction nozzle 13 sucks and picks up the chip parts 4 in the groove 100 of the chip sucking station and moves upwards. When the mounting head 14 moves upwards, the shutter drive lever 156 returns to the left, and the spring 156 energizes the shutter lever 153 to rotate. Then, the shutter 150 moves to the position of FIGS. 9 and 11 which covers the chip sucking station.

Then, again the action from 0° to 180° of FIG. 24 is carried out. That is, the turntable 12 rotates intermittently, the next mounting head 14 arrives at the sucking station. Assuming that the parts feed unit 7 which feeds the chip parts 4 to be picked up next is the same as the present unit, motor 8 does not rotate and the feed table 6 does not move. Therefore, the same parts feed unit 7 is positioned in the sucking station, and as described above, from 0° to 180°, the reciprocating rod 52 moves downwards, and the rotor 101 rotates to repeat the same action such as to feed the chip parts 4 to the chip sucking station, to feed the chip parts 4 from the shoot 77 to the chip separating station, and to align the chip parts 4 from the chamber 76 into the shoot 77. Subsequently, the actions from 180° to 360° of FIG. 24, such as opening the shutter 150, picking up the chip parts by the downward movement of the suction nozzle 13, and closing the shutter 150 are carried out as described above.

When the reciprocating rod 52 moves upwards and the oscillating lever 32 rotates clockwise in the FIG. 4, the solenoid (not shown) which restrains said lever 32 is energized to allow the restraining lever (not shown) to engage the restraining bolt (not shown) to restrain the counterclockwise movement of the oscillating lever 32. On the other hand, the solenoid which restrains the rotation of the oscillating lever 34 is energizes to move the restraining lever (not shown) counterclockwise to allow said lever 34 to move.

Figure 25:
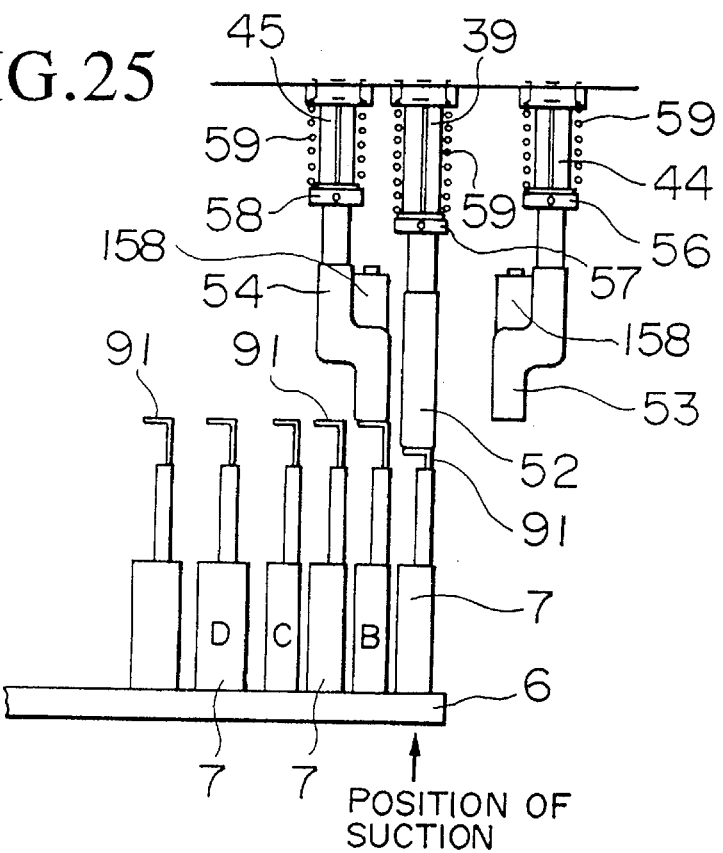
FIG. 25 is an elevational view showing the reciprocating action of the reciprocating rod.
Figure 26:
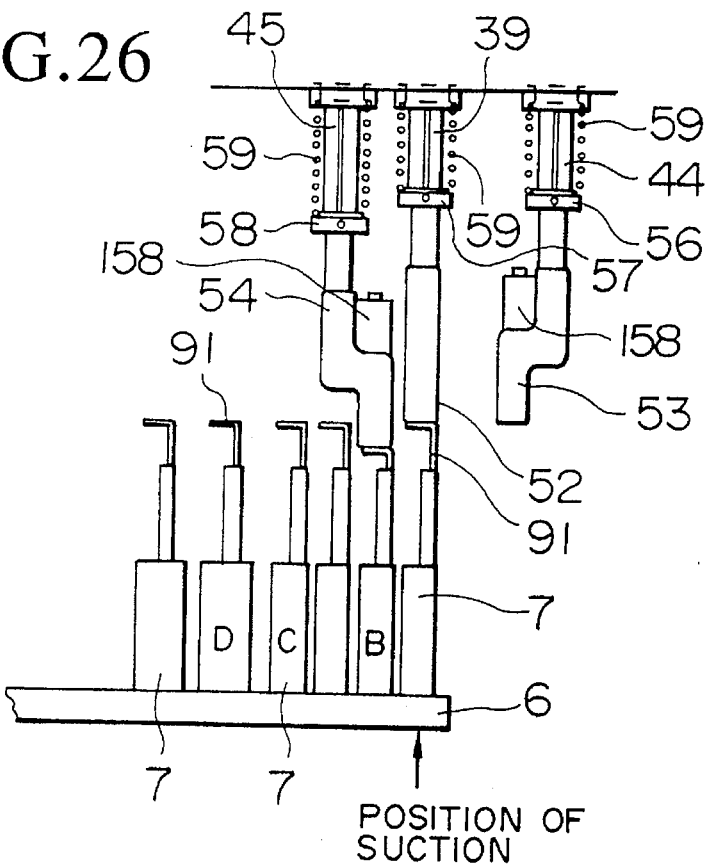
FIG. 26 is an elevational view showing the reciprocating action of the reciprocating rod.

During the duration of 180° to 360°, the shutter 150 of the parts feed unit 7 positioned at the part-sucking position and the parts 4 picking-up operate as described above. The cam (not shown) rotates to perform the feeding action of the parts feed unit 7 (rotation of the rotor 101 described above and the blowing off of the compressed air from the feed holes 81 and 82) in the position of "B" in FIG. 25 which is the parts feed unit 7 to dispense the chip parts 4 to be picked up next, and rotates the oscillating lever 34 to move the reciprocating rod 35 and the reciprocating board 41 downwards along the linear guide 40. The spring 59 drives the spline shaft 45 and the reciprocating rod 54 downwards to depress the engaging tab 91 as shown in FIG. 26. Moreover, the air pressure feed block 158 mounted to the reciprocating rod 54 moves downwards to connect the air holes 162 and 168 to the opening 87 and the vacuum opening 125, respectively as in the case of the reciprocating rod 52. Thus, the parts feed unit 7 at the position of B in FIG. 26 dispenses the chip parts 4 as described above. Then, the reciprocating rod 54 moves upwards. At this time, the motor 62 rotates to move the moving body 50 along the linear guide 66 to position the reciprocating rod 54 at the position shown by two-dot chain line in FIG. 4. Since the positional relationship between the engaging tab 91 and the openings 87 and 125 of the parts feed unit 7 is the same, the air holes 162 and 168 are connected with the openings 87 and 125.

Figure 27:
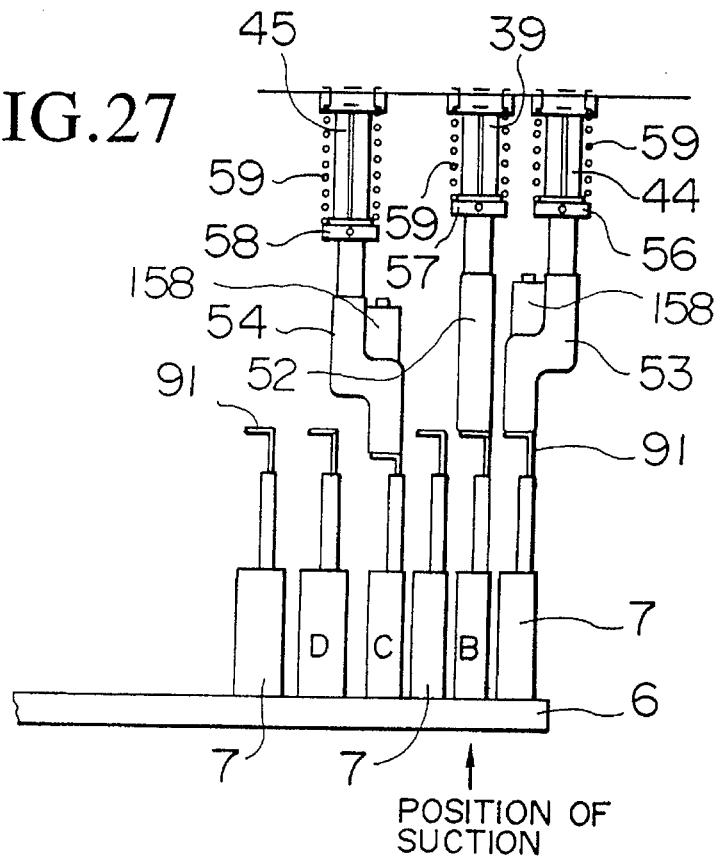
FIG. 27 is an elevational view showing the reciprocating action of the reciprocating rod.

During a next duration of 0° to 180°, as shown in the movement of parts feed portion of FIG. 24, the feed table 6 is moved, and the parts feed unit 7 at the position of "B" of FIG. 26 arrives at the sucking position of the suction nozzle 13, while the shutter 150 covers the chip sucking station of the rotor 101 as shown in FIGS. 9 and 11, thereby parts 4 do not fly out. During a next duration of 180° to 360°, the suction nozzle 13 picks up the chip parts 4 from said parts feed unit 7. During this picking-up action, the parts 4 is fed as described above with regard to the parts feed unit 7 at the position of "C" of FIG. 27 which feeds the chip parts to be picked up next. At this time, the moving body 50 moves to locate the reciprocating rod 54 to the position of the solid line of FIG. 4.

Figure 28:
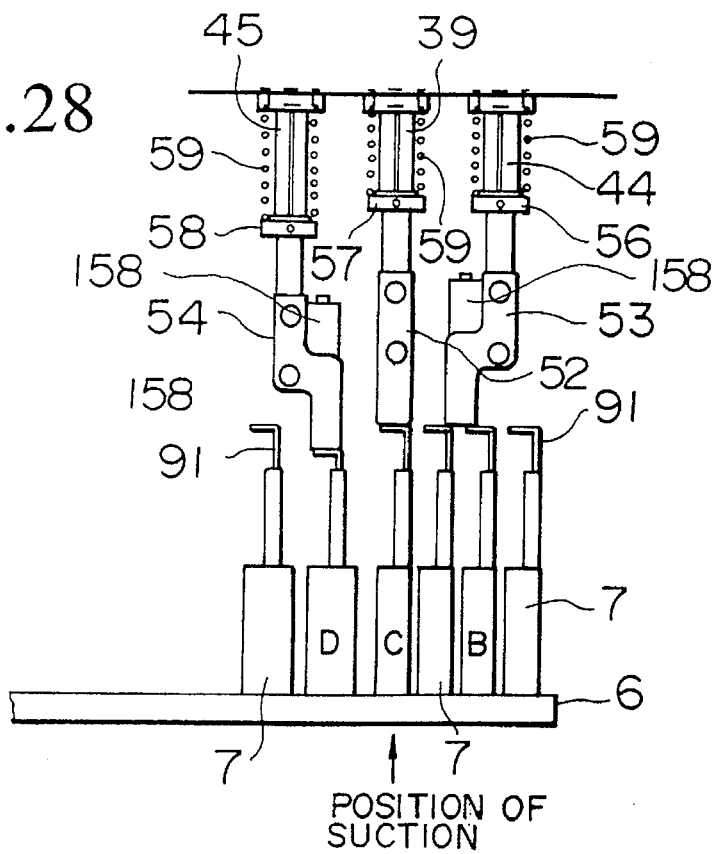
FIG. 28 is an elevational view showing the reciprocating action of the reciprocating rod.
Figure 29:
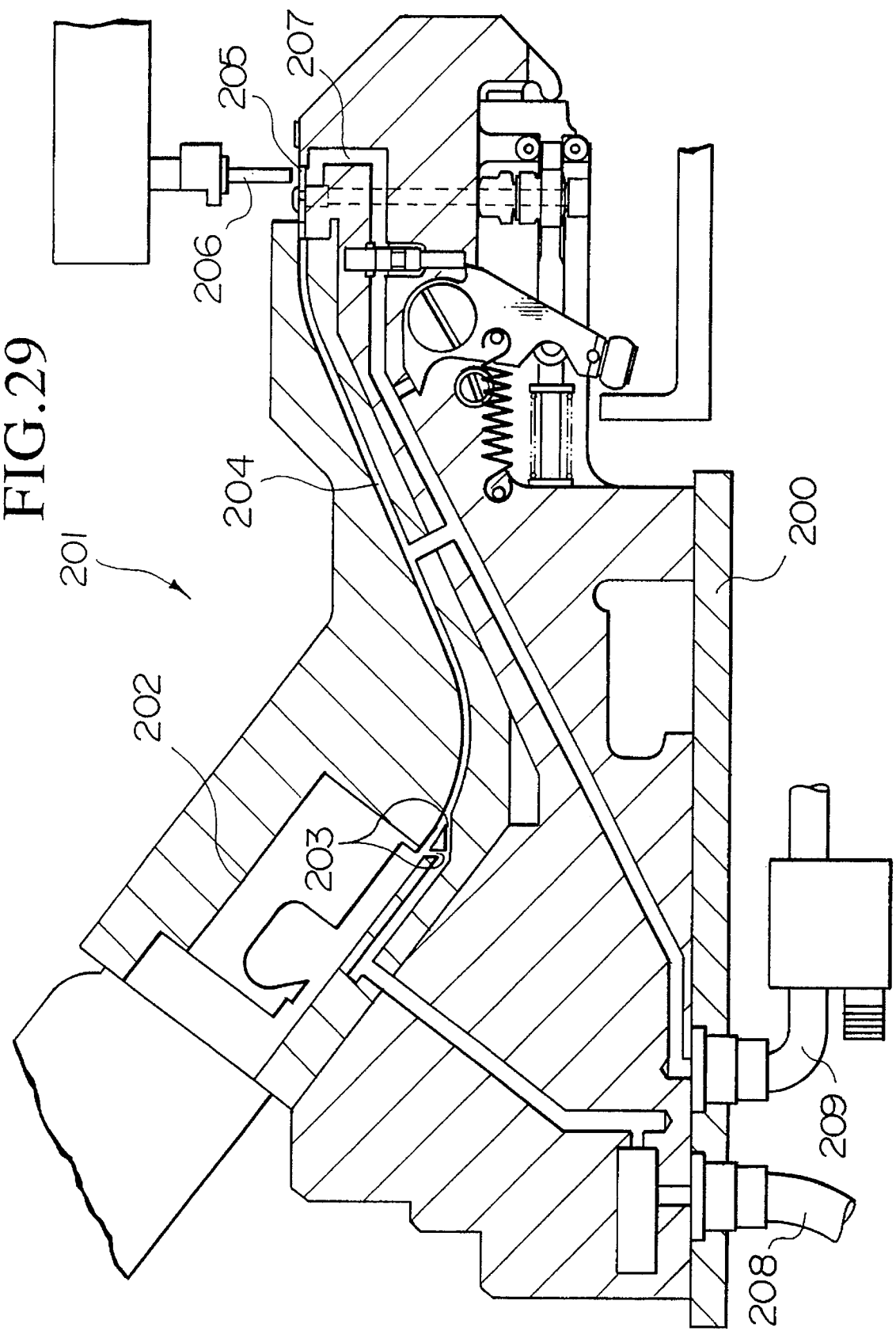
FIG. 29 is a side view showing the conventional example.

During the duration of 0° to 180°, the parts feed unit 7 at the position of "C" arrives at the sucking position of the suction nozzle 13, and during a next duration of 180° to 360°, the suction nozzle 13 picked up the parts 4, while the moving body 50 moves so that the reciprocating rod 54 locates at the position of the parts feed unit 7 at the position of "D", as shown in FIG. 28, and the same feeding action of parts 4 is carried out as described above by the downward movement of said reciprocating rod 54. The position of the reciprocating rod 54 is a central position between the solid line and the two-dot chain line of FIG. 4, since the width of the parts feed unit 7 of "D" is larger than that of the parts feed unit 7 of "C" (the width of the parts feed unit 7 of "B" and "C" is the same), and the positions of the engaging tab 91 and the openings 87 and 125 of "D" are spaced by 1.5 times than the position where "C" is positioned adjacent to "B" (the positional relationship between the engaging tab 91 and the openings 87 and 125 is the same as that if "C"), whereby the reciprocating rod 54 moves downwards to connect the air holes 162 and 168 with the openings 87 and 125.

The chip parts 4 picked up by the suction nozzle 13 at the suction station are moved to the recognition station by the intermittent rotation of the turntable 12. There, the parts 4 are recognized by the recognizer 15 and is moved to the angle correction station at which a nozzle rotating roller 16 corrects a possible angular error and locates the angular position in the direction of 8 specified by the data (not shown).

The suction nozzle 13 moves downwards at the mounting station to rotate the X-axial motor 2 and the Y-axial motor 3 of the XY table 1 to move the parts 4 to correct said positional error, which are mounted to the printed substrate 5 at a predetermined place.

In the manner described above, the chip parts 4 are picked up by the suction nozzle 13 from the parts feed units 7 and mounted on the printed substrate 5. In case that the suction nozzle 13 fails to suck the chip parts 4 at the chip sucking station, the rotor 101 rotates intermittently to discharge the chip parts 4 to the discharged chip storeroom 121 at the discharge station of the chip parts 4 which fail to be sucked.

When the number of the chip parts 4 in the parts feed device 7 is gradually reduced, by means of the warning device for shortage of parts (not shown) or when operator notices the reduction of the parts 4 in the bulk case 75 (the bulk case 75 is transparent or semitransparent so that the remaining amount of the part 4 can be confirmed), the operation of the device is suspended and the parts feed units 7 which have few parts remained are removed from the feed table 6 to get a new supply of parts by means of such as replacing the bulk case by a bulk case 75 filled with new parts. At this time, even if the parts feed units 7 are removed from the feed table 6, since the restraining pin 146 comes off from the upper face of the feed table 6, the lever 142 rotates clockwise as shown in FIG. 20, the release pin 145 comes off from the spring board 137, and the restraining board 138 depresses the chip parts 4 remaining in the shoot 77 so that the chip parts 4 aligned on the side of the rotor 101 of the shoot 77 do not return even if the parts feed units 7 decline towards the bulk case 75.

Accordingly, even if the chip parts 4 on the side of the bulk case 75 rather than the chip parts 4 depressed by said restraining board 138 in the shoot 77 return to the bulk case 75 (or even if the chip parts 4 until here are consumed), after getting new supply of parts 4, an air gun is pushed to the air compulsory feed opening 129 to blow off the compressed air intermittently to the air compulsory feed passage, whereby the chip parts 4 in the chamber 76 will align in the shoot 77. At this time, since the chip parts 4 are fed to the position farther than the position depressed by the restraining board 138, there is no need to supply the compressed air by an air gun while pushing the restraining pin 146, and the compressed air can be supplied while the restraining pin 146 remains untouched. After getting new supply of parts 4 in this manner, the parts feed units 7 are mounted on the feed table 6 at the predetermined position and the parts mounting action is continued. The supplementary action of the parts 4 may be carried out at the time of stage-replacing work where the arrangement of the parts feed units 7 is changed so as to change the stage on the other kind of printed substrate 5 after predetermined number of parts mounting to the printed substrate 5 is finished.

Since rods 159 and 165 are mounted/dismounted to/from the connected body 86 to feed the compressed air and vacuum pressure to the parts feed units 7 which carry out the parts feeding action, it is not required to feed air or vacuum pressure per parts feed unit 7 by a tube, and to provide a check valva for feeding compressed air or vacuum pressure on all places where the parts feed units 7 are mounted on the feed table 6 (a check valve which has a structure that it is connected when the parts feed unit 7 is mounted and it does not allow compressed air and vacuum pressure to leak when the parts feed unit 7 is not mounted has to be mounted to all the mounting position on the feed table 6, if it is not in the case of the present embodiment), whereby drastic cost down can be attained.

In the present embodiment, the vacuum suction in the parts feed unit 7 via the vacuum passage 124 is carried out only in separating the chip parts 4 from the shoot 77. It may be applied, however, to the case where a vacuum passage is formed in the position where the groove-circulating hole 123 moves from the vacuum hole 122 as the rotor 101 rotates to carry out the vacuum suction of the chip parts 4 in the groove 100 even during the rotation of the rotor 101. Even in the case where the parts 4 are prevented from flying out from the groove 100, an air-pressure feed block 158 is mounted to the reciprocating rod, and every time the feed table 6 moves, the reciprocating rod reciprocates vertically to feed the vacuum pressure.

Furthermore, in the present embodiment, the air-pressure feed block 158 is mounted to the reciprocating rods 52, 53 and 54. Said block 158, however, may be moved vertically by an independent reciprocating device other than the reciprocating rod to mount/dismount to/from the connected body 86 and to supply compressed air and vacuum pressure. Or if there is provided a drive lever only for opening/closing the bulb to feed intermittently the compressed air, said block may be integrally mounted to said lever. Of if there is provided a lever for driving the rotor which is a separating means, said block may be integrally mounted to said lever.

Furthermore, the present embodiment is described in the case where the feed table 6 can move to the arranged direction of the parts feed unit 7. However, when the feed table 6 is fixed and the suction nozzle moves to pick up the chip parts 4 from the desired parts feed unit 7, the reciprocating rod to which the air-pressure feed block 158 is mounted as in the reciprocating rods 53 and 54 of the present embodiment can move to feed compressed air or vacuum pressure to optional parts feed unit 7.

Furthermore, the reciprocating rods 52, 53 and 54 of the present embodiment moves vertically, however, they may move horizontally to supply the vacuum and compressed air.

Furthermore, in the present embodiment, it is the compressed air and vacuum pressure that are fed to the parts feed unit 7, it may be, however, other energies. For example, a motor is provided to the parts feed unit (so as to separate the parts from the shoot, or to open/close the valve for intermittent blowing off of the compressed air), and the motor is detachably connected in order to mount/dismount the knotted line for feeding the supply source, to supply other gaseous pressure instead of air pressure, to supply gas other than air for the use of other than the drive source, to supply liquid pressure such as water and oil instead of gas, or to supply for other purposes. Or the motor is connected to mount/dismount the signal line which transfers signals such as data.

Furthermore, in the present embodiment, rods 159 and 165 is abutted to the connected body 86, and the reciprocating rod 52 moves downwards to move the rods 159 and 165 upwards in the block 158 to flow the compressed air into the feed passage 85. But it may have the structure that the air hole 162 is always connected with the compressed air feed tube 166, and a solenoid valve is provided to be opened/closed in the midway between the tubes 160 and 166 and the compressed air source or vacuum source connected thereto to supply/stop the supply of the compressed air or negative pressure to tubes 160 and 166. That is, the rotation angle of the input axis of said index unit (not shown) in FIG. 24 is always made to be detected by a cam positioned (not shown). When the predetermined rotation angle of the input axis of the index unit is detected during one intermittent rotation of the turntable 12, the opening or closing action of said solenoid valve can be made in the similar timing as the present embodiment by a control unit (not shown) to carry out the blowing off of the compressed air or vacuum suction.

Since the present invention provides a detachable means to mount/dismount an air feed means to/from the air jet passage, or a detachable means to mount/dismount a vacuum pressure feed means to/from the vacuum sucking passage, the compressed air or vacuum pressure can be supplied to the parts feed unit without any leakage, while the time to mount the parts feed unit to the feed table can be reduced.

What is claimed is:

1. An automatic electronic parts mounting device wherein a feed table having a plurality of parts feed units, which guide chip parts stored in a storeroom for parts to a shoot connected with said storeroom and separate the parts from an exit of the shoot by a separating means to feed them to a parts feeding position, moves to a direction arranged of said units and a suction nozzle picks up the chip parts from desired said unit suspended at a parts picking-up position to mount it to a printed substrate, there are provided an air jet passage arranged in each parts feed unit for jetting air so as to stir and guide chip parts stored in the storeroom for parts or to transfer chip parts aligned in the shoot to the exit side of the shoot, an air feed means for feeding air to said air jet passage, and an attaching/detaching means arranged outside said feed table for reciprocately attaching/detaching said air feed means to said air jet passage.

2. An automatic electronic parts mounting device as set forth in claim 1, wherein a drive member is arranged outside said feed table for initiating separating action of said separating means, and said attaching/detaching means is integrally arranged to said drive member.

3. An automatic electronic parts mounting device wherein a feed table having a plurality of parts feed units, which guide chip parts stored in a storeroom for parts to a shoot connected with said storeroom, and separate the parts from an exit of the shoot by a separating means to feed them to a parts feeding position, moves to a direction arranged of said units and a suction nozzle picks up the chip parts from desired said unit suspended at a parts picking-up position to mount it to a printed substrate, there are provided a vacuum-sucking passage arranged in each parts feed unit for vacuum-sucking chip parts separated by said separating means, a vacuum pressure feed means for feeding vacuum pressure to said vacuum-sucking passage, and an attaching/detaching means arranged outside said feed table for reciprocatingly attaching/detaching said vacuum pressure feed means to said vacuum-sucking passage.

4. An electronic parts mounting device, comprising:
a feed table;
a parts feed unit demountably coupled to said feed table wherein said parts feed unit comprises:
a means for storing a plurality of parts;
a means for aligning said parts in a shoot;
an air jet passage communicating with said means for storing said parts, said shoot and an external opening;
a means for separating said parts from said shoot and positioning said parts at a predetermined location;
a vacuum passage communicating with said means for separating and positioning said parts and an external opening;
a means for supplying said air to said air jet passage;
a means for reciprocatingly supplying said vacuum to said vacuum passage;
a means for reciprocatingly coupling and decoupling said air supply means from said external opening of said air jet passage and for coupling and decoupling said vacuum supply means from said external opening of said vacuum passage; and
a means for transporting said parts from said predetermined position of said parts feeding station and mounting said parts onto a printed substrate.

* * * * *